(12) United States Patent
Lee et al.

(10) Patent No.: US 9,847,456 B2
(45) Date of Patent: Dec. 19, 2017

(54) LIGHT EMITTING DIODE AND METHOD OF FABRICATING THE SAME

(71) Applicant: Seoul Viosys Co., Ltd., Ansan-si (KR)

(72) Inventors: So Ra Lee, Ansan-si (KR); Jae Hye Jung, Ansan-si (KR); Chang Yeon Kim, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 83 days.

(21) Appl. No.: 14/671,955

(22) Filed: Mar. 27, 2015

(65) Prior Publication Data
US 2015/0280070 A1 Oct. 1, 2015

(30) Foreign Application Priority Data

Mar. 27, 2014 (KR) .................. 10-2014-0035925
Mar. 13, 2015 (KR) .................. 10-2015-0035117

(51) Int. Cl.
| | |
|---|---|
| *H01L 33/36* | (2010.01) |
| *H01L 33/22* | (2010.01) |
| *H01L 33/50* | (2010.01) |
| *H01L 33/60* | (2010.01) |
| *H01L 33/64* | (2010.01) |
| *H01L 33/38* | (2010.01) |
| *H01L 33/40* | (2010.01) |

(52) U.S. Cl.
CPC ............ *H01L 33/36* (2013.01); *H01L 33/22* (2013.01); *H01L 33/38* (2013.01); *H01L 33/505* (2013.01); *H01L 33/60* (2013.01); *H01L 33/647* (2013.01); *H01L 33/382* (2013.01); *H01L 33/405* (2013.01); *H01L 2224/48091* (2013.01)

(58) Field of Classification Search
CPC ...... H01L 33/36–33/387; H01L 33/405; H01L 33/50–33/508; H01L 33/64–33/648
See application file for complete search history.

(56) References Cited

U.S. PATENT DOCUMENTS

| | | | | |
|---|---|---|---|---|
| 8,866,180 B2 * | 10/2014 | Kim | ................ | H01L 33/387 257/98 |
| 9,048,409 B2 * | 6/2015 | Seo | ................ | H01L 27/153 |
| 2013/0049036 A1* | 2/2013 | Jeong | ................ | H01L 27/153 257/91 |
| 2014/0175498 A1* | 6/2014 | Lai | ................ | H01L 33/20 257/99 |

FOREIGN PATENT DOCUMENTS

KR   20130071077 A  *  6/2013  ............. H01L 33/50

* cited by examiner

*Primary Examiner* — Jose R Diaz
(74) *Attorney, Agent, or Firm* — Perkins Coie LLP

(57) ABSTRACT

Embodiments provide a light emitting diode and a method of fabricating the same. The light emitting diode includes a base, a light emitting structure disposed on the base, at least one first electrode disposed on the light emitting structure; and a second electrode disposed under the light emitting structure, wherein at least a portion of the second electrode is covered by the base and the base includes a supporting insulator and at least one bulk electrode embedded in the supporting insulator and electrically connected to the light emitting structure, and a surface of the at least one bulk electrode is exposed through the supporting insulator. The light emitting diode has excellent reliability and efficiency.

37 Claims, 14 Drawing Sheets

(a)                    (b)

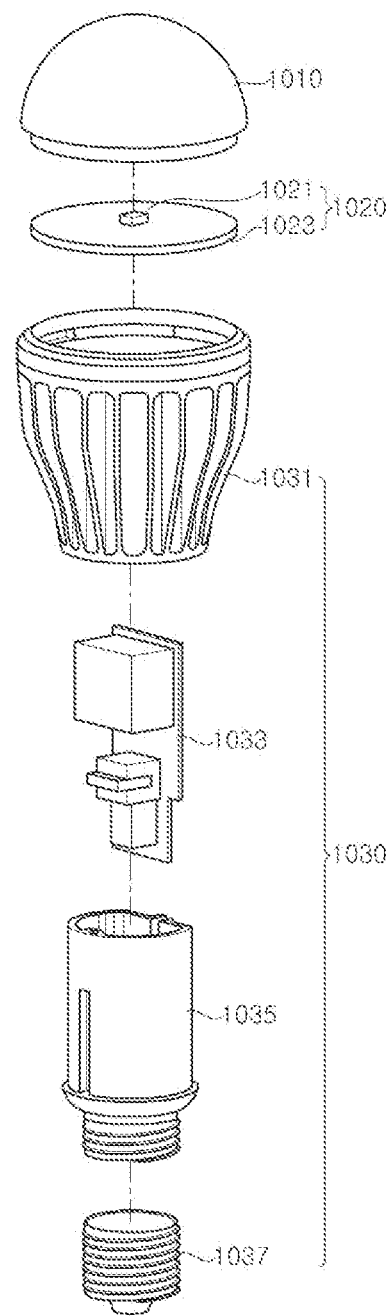

LIGHT EMITTING DIODE AND METHOD OF FABRICATING THE SAME

PRIORITY CLAIMS AND CROSS-REFERENCE TO RELATED APPLICATION

This patent document claims priorities and benefits of Korean Patent Application No. 10-2014-0035925, filed on Mar. 27, 2014 and Korean Patent Application No. 10-2015-0035117, filed on Mar. 13, 2015, the contents of which are incorporated by reference.

TECHNICAL FIELD

This patent document relates to a light emitting diode and a method of fabricating the same. In exemplary embodiments, the light emitting diode is fabricated by separating a growth substrate at the wafer level.

BACKGROUND

Light emitting diodes refer to semiconductor devices that emit light generated by recombination of electrons and holes, and are used in a variety of fields such as displays, vehicle lamps, general lighting devices, and the like.

Light emitting diodes can be classified into lateral type light emitting diodes, vertical type light emitting diodes, and flip-chip type light emitting diodes according to locations of electrodes or a connection type between the electrodes and an external lead.

SUMMARY

Exemplary embodiments provide a method of fabricating a light emitting diode, which allows a growth substrate to be separated over a large area by minimizing or preventing a bowing phenomenon after separation of the growth substrate from a semiconductor layer.

Exemplary embodiments provide a method of fabricating a light emitting diode, which allows formation of a wavelength conversion layer and separation of a growth substrate at the wafer level.

Exemplary embodiments provide a light emitting diode fabricated at the wafer level.

Exemplary embodiments provide a light emitting diode, in which a base including a plurality of bulk electrodes is formed to minimize damage to the light emitting diode in fabrication of the light emitting diode.

Exemplary embodiments provide a light emitting diode which has improved heat dissipation efficiency through a plurality of bulk electrodes.

In accordance with one exemplary embodiment, a light emitting diode is provided to include: a base; a light emitting structure disposed on the base; at least one first electrode disposed on the light emitting structure; and a second electrode disposed under the light emitting structure, wherein at least a portion of the second electrode is covered by the base, the base includes a supporting insulator and at least one bulk electrode embedded in the supporting insulator and electrically connected to the light emitting structure, and a surface of the at least one bulk electrode is exposed through the supporting insulator.

In some implementations, the supporting insulator may include a ceramic supporting insulator.

In some implementations, the second electrode may include a reflective metal layer and a cover metal layer covering at least a portion of the reflective metal layer.

In some implementations, the base may include at least two bulk electrodes separated from each other and the at least two bulk electrodes may be disposed under the second electrode while contacting the second electrode.

In some implementations, the light emitting diode may further include a wavelength conversion layer disposed over the light emitting structure, and an upper surface of the wavelength conversion layer may be flush with an upper surface of the first electrode.

In some implementations, the wavelength conversion layer may be disposed over an upper surface of the light emitting structure.

In some implementations, the light emitting diode may include two or more first electrodes, the two or more first electrodes may be disposed adjacent to one another at one corner of the light emitting structure.

In some implementations, the light emitting structure may include an active layer; a first conductive type semiconductor layer disposed on the active layer; and a second conductive type semiconductor layer disposed under the second conductive type semiconductor layer.

In some implementations, the light emitting structure may include a rough upper surface.

In accordance with another exemplary embodiment, a light emitting diode is provided to include: a base; a light emitting structure disposed over the base and including a first conductive type semiconductor layer, a second conductive type semiconductor layer, and an active layer, wherein the active layer is disposed between the second conductive type semiconductor layer and the first conductive type semiconductor layer; at least one groove formed on a lower surface of the light emitting structure and partially exposing the first conductive type semiconductor layer; a second electrode disposed at least over a lower surface of the second conductive type semiconductor layer and electrically connected to the second conductive type semiconductor layer; an insulation layer partially covering the second electrode and the light emitting structure and including at least one opening corresponding to the at least one groove; and a first electrode electrically connected to the first conductive type semiconductor layer exposed through the groove and at least partially covering the insulation layer, wherein the base includes a supporting insulator; and a plurality of bulk electrodes embedded in the supporting insulator and electrically connected to the first electrode.

In some implementations, the bulk electrodes may include a heat dissipation unit and an electrode unit.

In some implementations, the electrode unit may be disposed to surround the heat dissipation unit.

In some implementations, the bulk electrodes may include at least two electrode units, and the heat dissipation unit may be disposed between the two electrode units.

In some implementations, the second electrode may include a second contact layer contacting the second conductive type semiconductor layer and a second cover layer at least partially covering the second contact layer, wherein a portion of the second cover layer may extend from one side surface of the light emitting structure such that an upper side of the portion of the second cover layer is exposed.

In some implementations, the light emitting diode may further include a second electrode pad disposed over the exposed portion of the second cover layer extending from one side surface of the light emitting structure.

In some implementations, the bulk electrodes may include a metal or metal particles.

In some implementations, the supporting insulator may include at least one of EMC or a ceramic material.

In some implementations, the base may have a thickness in the rage of 10 μm to 100 μm.

In accordance with another exemplary embodiment, a light emitting device is provided to include: a substrate; and a light emitting diode, the light emitting diode including: a base; a light emitting structure disposed over the base and including a first conductivity type semiconductor layer, a second conductive type semiconductor layer, and an active layer, wherein the active layer is disposed between the second conductive type semiconductor layer and the first conductive type semiconductor layer; at least one groove formed on a lower surface of the light emitting structure and partially exposing the first conductive type semiconductor layer; a second electrode disposed at least over a lower surface of the second conductive type semiconductor layer and electrically connected to the second conductive type semiconductor layer; an insulation layer partially covering the second electrode and the light emitting structure and including at least one opening corresponding to the at least one groove; and a first electrode electrically connected to the first conductive type semiconductor layer exposed through the groove and at least partially covering the insulation layer, wherein the base includes a supporting insulator; and a plurality of bulk electrodes embedded in the supporting insulator and electrically connected to the first electrode.

In accordance with another exemplary embodiment, a light emitting device is provided a substrate and a light emitting diode, the light emitting diode including a base including bulk electrodes separated from one other and a supporting insulator disposed between the bulk electrodes; a light emitting structure disposed over the base and including a first conductive type semiconductor layer, a second conductive type semiconductor layer, and an active layer disposed between the first and second conductive type semiconductor layers and over the second conductive type semiconductor layer; a second electrode disposed over a surface of the second conductive type semiconductor layer and electrically connected to the second conductive type semiconductor layer; a first electrode electrically connected to the first conductive type semiconductor layer; and a wavelength conversion layer disposed over the light emitting structure with the first electrode embedded within and exposed through the wavelength conversion layer, and wherein a difference in thermal expansion coefficients between the supporting insulator and the light emitting structure is smaller than a difference in thermal expansion coefficients between one of the bulk electrodes and the light emitting structure.

In some implementations, the bulk electrodes may include a heat dissipation unit and an electrode unit.

In some implementations, the substrate may include a body portion, a first lead electrode, and a second lead electrode, wherein the bulk electrodes of the light emitting diode may be electrically connected to the first lead electrode.

In some implementations, the first lead electrode may include a first upper electrode disposed over the body portion; a first lower electrode disposed under the body; and a first via electrode electrically connecting the first upper electrode to the first lower electrode.

In some implementations, the light emitting diode may be disposed over the first lead electrode and the first via electrode may be disposed under the heat dissipation unit of the bulk electrode.

In some implementations, the substrate may further include a heat dissipation pad disposed over the body portion, and the heat dissipation pad is disposed adjacent to the heat dissipation unit.

In some implementations, the heat dissipation pad may be spaced apart from the first lead electrode.

In some implementations, the substrate may include first and second lead electrodes including a bulk metal and an insulation layer disposed between the first and second lead electrodes, and the electrode unit may be electrically connected to the first lead electrode.

In some implementations, the substrate may further include a heat dissipation electrode including a bulk metal, and the heat dissipation electrode is disposed adjacent to the heat dissipation unit.

In some implementations, the heat dissipation unit may be surrounded by the electrode unit and the heat dissipation electrode may be surrounded by the first lead electrode.

According to embodiments of the present disclosure, even upon separation of a growth substrate from a semiconductor layer in fabrication of a light emitting diode, it is possible to prevent the semiconductor layer from suffering a bowing phenomenon, whereby the growth substrate can be separated from the semiconductor layer at the wafer level.

Further, according to the embodiments of the present disclosure, a wavelength conversion layer can be easily formed at the wafer level while allowing separation of the growth substrate in a large area at the wafer level and preventing the wavelength conversion layer from being damaged in the course of separation into individual devices.

Furthermore, a light emitting diode fabricated by the method according to embodiments of the present disclosure has a very low possibility of damage or failure in the fabrication process, thereby securing high reliability and efficiency.

Furthermore, the base of the light emitting diode includes a plurality of bulk electrodes, which includes an electrode unit and a heat dissipation unit, thereby improving heat dissipation efficiency.

BRIEF DESCRIPTION OF DRAWINGS

FIG. 19 is an exploded perspective view of an exemplary lighting apparatus to which a light emitting device according to some embodiments of the present disclosure is applied.

DETAILED DESCRIPTION

Figure 1:
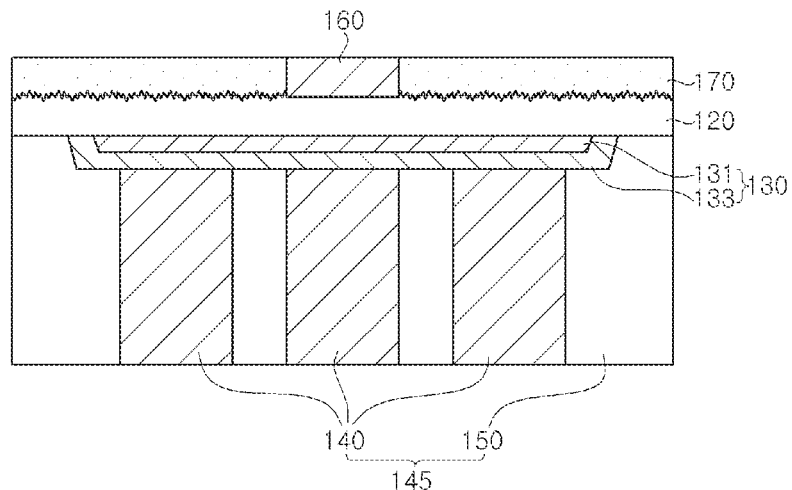
FIG. 1 and FIG. 2 are sectional views of an exemplary light emitting diode according to some embodiments of the present disclosure.

Lateral type light emitting diodes can be fabricated relatively easily and thus tend to be the most widely used. A lateral type light emitting diode includes a growth substrate at a lower side thereof instead of being separated therefrom. For the growth substrate of the light emitting diode, a sapphire substrate tend to be the most widely used but due to its low thermal conductivity, the sapphire substrate has difficulty in discharging heat from the light emitting diode. As a result, the light emitting diode has an increased junction temperature, decreased internal quantum efficiency, and becomes unsuitable for high current operation.

Vertical type or flip-chip type light emitting diodes are can address the problems of the lateral type light emitting diode. Particularly, the vertical type light emitting diode includes a lower semiconductor layer and an upper semiconductor layer formed of different conductive type semiconductors, and requires electrodes respectively connected to the upper and lower semiconductor layers. The disclosed technology provides for a process of separating a growth substrate from the semiconductor layers during vertical type light emitting diode fabrication.

Hereinafter, embodiments of the present disclosure will be described in detail with reference to the accompanying drawings. The following embodiments are provided by way of various examples and implementations of the disclosed technology. Accordingly, the present disclosure is not limited to the embodiments disclosed herein and may also be implemented in different forms. In the drawings, certain features including widths, lengths, thicknesses, and the like of elements may be exaggerated for clarity and descriptive purposes. When an element or layer is referred to as being "disposed on" or "disposed on" another element or layer, it may be directly "disposed on" or "disposed on" the other element or layer or intervening elements or layers may be present. Throughout the specification, like reference numerals denote like elements having the same or similar functions.

Generally, in order to prevent damage to the semiconductor layers caused by a separation of the growth substrate, a metal substrate is bonded to the semiconductor layer at an opposite side to the growth substrate before the separation of the growth substrate from the semiconductor layer. Then, the growth substrate is separated from the semiconductor layer by suitable technologies including laser lift-off, chemical lift-off, or stress lift-off. The metal substrate is bonded to the semiconductor layer via a separate bonding layer, which serves to bond the metal substrate to the semiconductor layer while being cooled from a certain bonding temperature or more to room temperature.

On the other hand, the metal substrate and the semiconductor layer, for example, a gallium nitride-based semiconductor layer, have different coefficients of thermal expansion, thereby causing a bowing phenomenon wherein the semiconductor layer is bent while being cooled from the bonding temperature to room temperature. Such a bowing phenomenon becomes severe when the growth substrate is separated over a large area. When the growth substrate is separated over a large area, there is a high possibility that the semiconductor layer is damaged due to the bowing phenomenon. Thus, it becomes difficult to separate the growth substrate at the wafer level. In order to prevent damage to the semiconductor layer caused by the bowing phenomenon, the growth substrate is separated from individual light emitting diodes after the wafer is divided into unit devices. As a result, a conventional method of fabricating a vertical type light emitting diode requires a complicated process and high manufacturing costs.

Further, in fabrication of the vertical type light emitting diode which includes a phosphor layer covering a surface of the semiconductor layer separated from the growth substrate, when the metal substrate is divided into unit devices after the phosphor layer is formed at the wafer level, the phosphor layer can be damaged upon division of the metal substrate. For example, since the metal substrate is divided into unit devices by laser scribing due to difficulty in physical division of the metal substrate using a blade and the like, the phosphor layer can be damaged by laser beams upon division of the metal substrate. Accordingly, in the conventional fabrication method, since it is difficult to form the phosphor layer at the wafer level, the phosphor layer is formed after dividing the wafer into unit devices.

Figure 2:
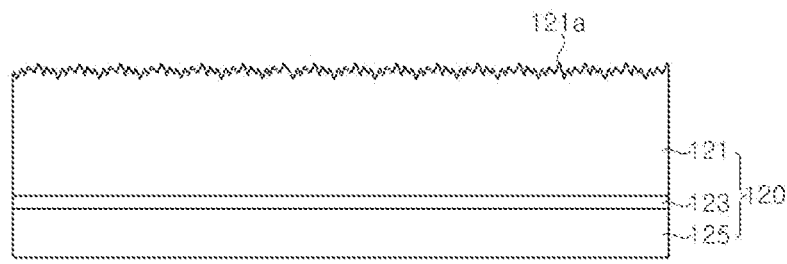

Various examples of implementations of the disclosed technology provides for a method of fabricating a vertical type light emitting diode, which can minimize a degree of bowing upon separation of the growth substrate while allowing formation of a phosphor layer at the wafer level FIG. 1 and FIG. 2 are sectional views of an exemplary light emitting diode according to some embodiments of the present disclosure. Particularly, FIG. 2 is an enlarged sectional view of a light emitting structure 120 of FIG. 1.

Referring to FIG. 1 and FIG. 2, the light emitting diode includes a base 145, the light emitting structure 120, and a first electrode 160. In addition, the light emitting diode may further include a wavelength conversion layer 170.

The base 145 may be disposed at a lower or bottom side of the light emitting diode to support the light emitting structure 120. The base 145 may include bulk electrodes 140 and a supporting insulator 150, and may further include a second electrode 130.

The bulk electrodes 140 may be electrically connected to the light emitting structure 120, and the base 145 may include one or more bulk electrodes. For example, the base 145 may include three bulk electrodes 140, which may be separated from one another. Further, the bulk electrodes 140 may be embedded in the supporting insulator 150, and lower surfaces of the bulk electrodes 140 may be exposed to a lower or bottom surface of the light emitting diode instead of being covered by the supporting insulator 150. Accordingly, the lower surfaces of the bulk electrodes 140 may serve as electrode pads through which the light emitting diode may be connected to an external power source.

Although not shown in the drawings, the light emitting diode may further include a second electrode pad (not shown) contacting the lower surfaces of the bulk electrodes 140.

The bulk electrodes 140 may include a metal, for example, at least one of Ni, Pt, Pd, Rh, W, Ti, Cr, Al, Ag or Au. The bulk electrodes 140 may be composed of or include a single layer or multiple layers.

The supporting insulator 150 may be disposed under the light emitting structure 120 and may be formed to cover or surround side surfaces of the bulk electrodes 140 such that the bulk electrodes 140 are embedded in the supporting insulator 150. The lower surfaces of the bulk electrodes 140 may be exposed to a lower surface of the supporting insulator 150, and may be flush with the lower surface of the supporting insulator 150.

The supporting insulator 150 may include a variety of insulating materials, for example, a ceramic supporting insulator. In addition, the supporting insulator 150 may have a substantially similar coefficient of thermal expansion to that of the light emitting structure 120.

The supporting insulator 150 may have substantially the same thickness as in the case of using a typical metal substrate as a support substrate, and may have a thickness of, for example, about 100 μm.

In some implementations, the base 145 may further include a second electrode 130 disposed between the light emitting structure 120 and the bulk electrodes 140. The second electrode 130 may contact the emitting structure 120 and the bulk electrodes 140. Further, the bulk electrodes 140 may be disposed within a region, in which the second electrode 130 is formed, so as to contact the second electrode 130.

The second electrode 130 may include a reflective metal layer 131 and a cover metal layer 133. The cover metal layer 133 may cover or surround a surface and a side surface of the reflective metal layer 131.

The reflective metal layer 131 may act as a reflector reflecting light and as an electrode electrically connected to the light emitting structure 120. Accordingly, the reflective metal layer 131 preferably includes a material having high reflectivity and capable of forming ohmic contact. The reflective metal layer 131 may include at least one of, for example, Ni, Pt, Pd, Rh, W, Ti, Al, Ag or Au. The cover metal layer 133 prevents interdiffusion between the reflective metal layer 131 and other materials. Accordingly, it is possible to prevent increase in contact resistance and decrease in reflectivity caused by damage to the reflective metal layer 131. The cover metal layer 133 may include Ni, Cr or Ti, and may be composed of or include multiple layers.

The light emitting structure 120 may include a second conductive type semiconductor layer 125, an active layer 123 disposed on the second conductive type semiconductor layer 125, and a first conductive type semiconductor layer 121 disposed on the active layer 123. Further, the light emitting structure 120 may include a rough surface 121a formed on an upper surface of the light emitting structure 120, thereby providing improved light extraction efficiency.

The first conductive type semiconductor layer 121 may include a nitride-based semiconductor such as (Al, Ga, In)N and may be doped with n-type impurities, for example, Si, to become an n-type conductive semiconductor layer. For example, the first conductive type semiconductor layer 121 may include n-type GaN.

The active layer 123 may include a nitride-based semiconductor such as (Al, Ga, In)N and may have a multi-quantum well (MQW) structure. It is possible to allow the active layer 123 to emit light having a desired peak wavelength by adjusting elements and compositions of semiconductor layers constituting the multi-quantum well structure.

The second conductive type semiconductor layer 125 may include a nitride-based semiconductor such as (Al, Ga, In)N and may be doped with p-type impurities, for example, Mg, to become a p-type semiconductor layer. Accordingly, the second conductive type semiconductor layer 125 may have an opposite conductive type to that of the first conductive type semiconductor layer 151. It should be understood that the present disclosure is not limited thereto and other implementations are also possible. For example, the first and second conductive type semiconductor layers may be formed as p-type and n-type conductive layers, respectively.

Herein, descriptions of well-known techniques related to the semiconductor layers 151, 153 and 155 including nitride semiconductors are omitted.

The first electrode 160 may be disposed on the light emitting structure 120 and may be electrically connected to the light emitting structure 120.

As shown, the rough surface 121a may not be formed in a region of the upper surface of the light emitting structure 120 in which the first electrode 160 is formed. Accordingly, the first electrode 160 and the light emitting structure 120 can form efficient ohmic contact and have low contact resistance. It should be understood that the present disclosure is not limited thereto. For example, the rough surface 121a may be formed in the region of the upper surface of the light emitting structure 120 in which the first electrode 160 is formed.

In some implementations, the light emitting diode may include at least two first electrodes 160, which may be disposed near one corner of the light emitting structure 120.

The first electrode 160 may include at least one of Ni, Pt, Pd, Rh, W, Ti, Cr, Al, Ag or Au, and may be composed of or include a single layer or multiple layers. For example, the first electrode 160 may have a multilayer structure that includes a first electrode pad (not shown) and a first bump electrode (not shown), in which the first electrode pad may include Ni/Al/Ni/Au layers and the first bump electrode may include an Au layer.

The wavelength conversion layer 170 may be disposed on the light emitting structure 120, and may be formed to cover or surround a side surface of the first electrode 160 while exposing an upper surface of the first electrode 160. An upper surface of the wavelength conversion layer 170 may be flush with the upper surface of the first electrode 160. Further, the wavelength conversion layer 170 may be disposed on the upper surface of the light emitting structure 120.

The wavelength conversion layer 170 may include phosphors and a resin. The phosphors may be mixed with the resin to be randomly or evenly dispersed in the resin. The wavelength conversion layer 170 may convert light emitted from the light emitting structure 120 into light having different wavelengths. As a result, a white light emitting diode can be realized.

The resin may include a polymer resin such as an epoxy resin, an acryl resin, or a silicone resin, and may act as a matrix for dispersing the phosphors.

The phosphors excite light emitted from the light emitting structure 120 to convert the light into light having different wavelengths. The phosphors may include various phosphors that are available in the art, and may include at least one type of phosphor selected from among, for example, garnet phosphors, aluminate phosphors, sulfide phosphors, oxynitride phosphors, nitride phosphors, fluoride phosphors, or silicate phosphors, without being limited thereto.

In the light emitting diode, the base 145 including the supporting insulator 150, which has a similar coefficient of thermal expansion to that of the light emitting structure 120, acts as a support substrate, thereby minimizing the bowing phenomenon of the light emitting structure 120 upon separation of the growth substrate. As a result, stress applied to the light emitting structure 120 is minimized, thereby minimizing damage to the light emitting structure 120 after separation of the growth substrate. Accordingly, the light emitting diode according to the embodiment includes the light emitting structure 120 which has good quality through minimization of defects, thereby securing high reliability and efficiency.

FIG. 3 to FIG. 11 are sectional views illustrating an exemplary method of fabricating a light emitting diode according to some embodiments of the present disclosure. In this embodiment, the same reference numerals as those of the embodiment described with reference to FIGS. 1 and 2 denote substantially the same components, and detailed descriptions thereof will be omitted.

Figure 3:
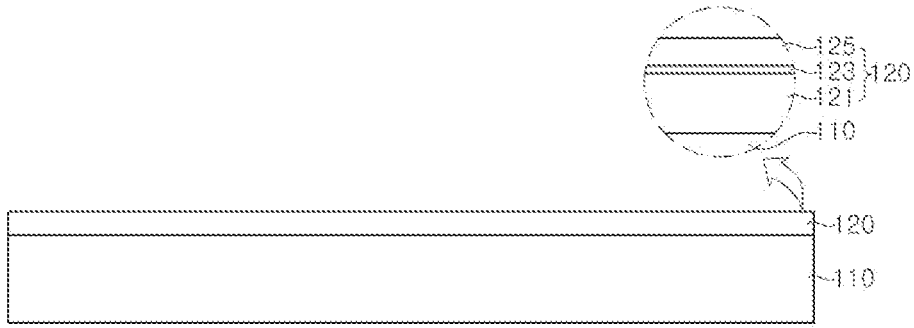
FIG. 3 to FIG. 11 are sectional views illustrating an exemplary method of fabricating a light emitting diode according to some embodiments of the present disclosure.

Referring to FIG. 3, a light emitting structure 120 is formed on a growth substrate 110.

The growth substrate 110 may be selected from any substrates capable of growing the light emitting structure 120 thereon, and may include, for example, a sapphire substrate, a silicon carbide substrate, a gallium nitride substrate, an aluminum nitride substrate, or a silicon substrate, and the like. As an example, the growth substrate 110 may be a patterned sapphire substrate (PSS) or a nitride substrate.

The light emitting structure 120 may include a first conductive type semiconductor layer 121, an active layer 123, and a second conductive type semiconductor layer 125, and these semiconductor layers may include a nitride-based semiconductor. The light emitting structure 120 may be formed by growing the semiconductor layers on the growth layer through a growth technology such as MOCVD, HVPE or MBE.

In addition, the growth substrate 110 may be a growth substrate at the wafer level. Accordingly, a plurality of light emitting diodes may be provided from the light emitting structure 120 grown on the growth substrate 110 through a series of processes described below.

Figure 4:
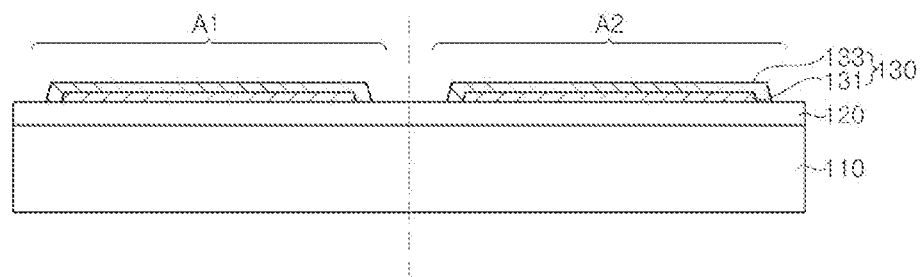

Then, referring to FIG. 4, a second electrode 130 may be formed on the light emitting structure 120.

The second electrode 130 may be formed on the light emitting structure 120 so as to be disposed on each device area of the light emitting structure 120. For example, as shown in FIG. 4, the light emitting structure 120 may be divided into a first device area A1 and a second device area A2, and the second electrode 130 may be formed on each of the first and second device areas A1, A2. In this embodiment, the light emitting structure 120 and the growth substrate 110 are illustrated as being divided into two device areas. However, the present disclosure is not limited thereto and the light emitting structure 120 and the growth substrate 110 may be divided into various number of device areas. Accordingly, the disclosed technology of this patent document also provides a structure wherein the light emitting structure 120 is divided into three or more device areas at the wafer level.

The second electrode 130 may include a reflective metal layer 131 and a cover metal layer 133. The second electrode 130 may be formed through deposition and lift-off, and the cover metal layer 133 may be formed so as to cover the reflective metal layer 131 after formation of the reflective metal layer 131. It should be noted that formation of the second electrode 130 is not limited thereto and may be achieved through various methods.

Figure 5:
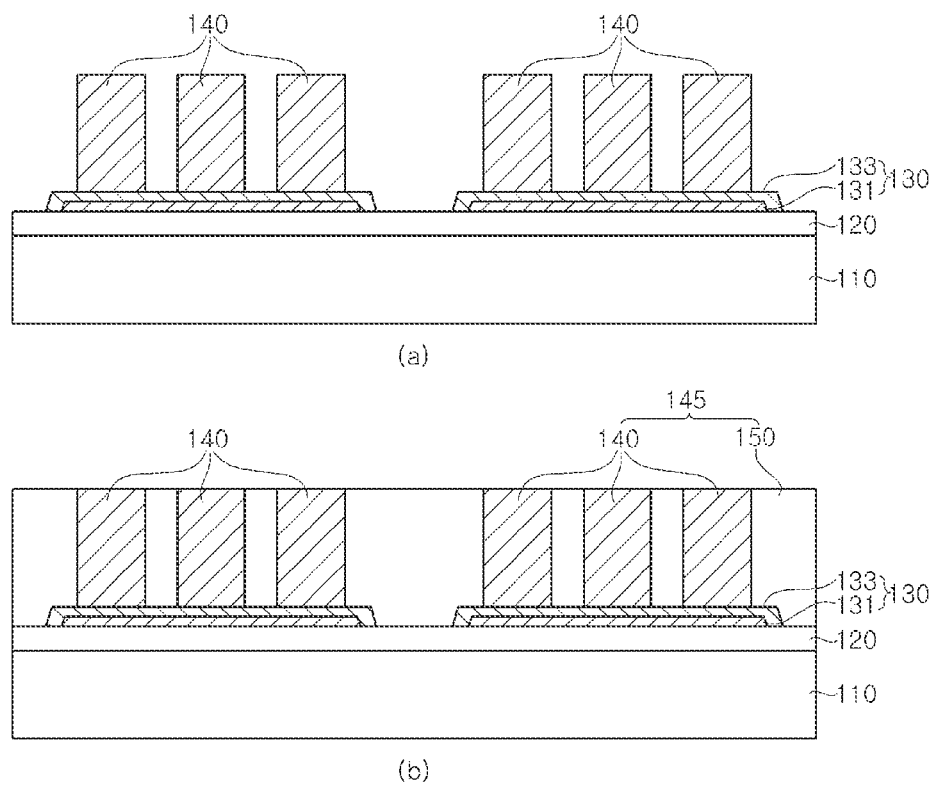
Figure 6:
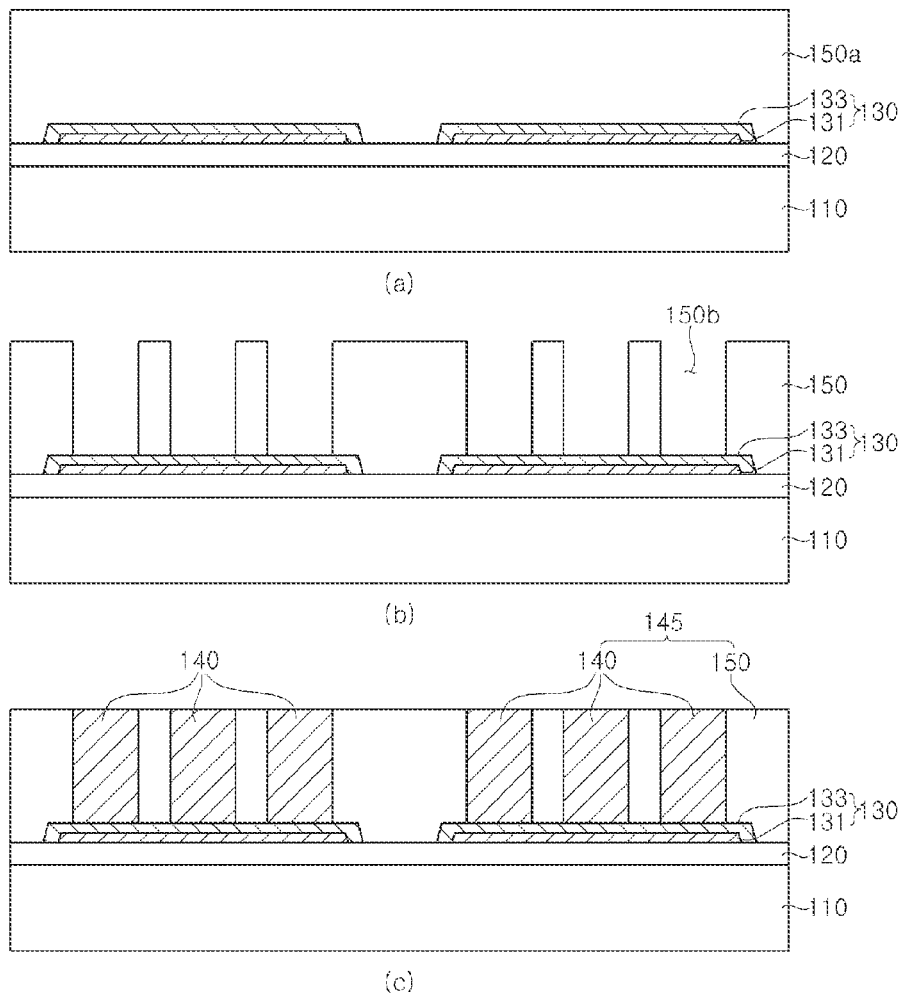

Next, referring to FIG. 5 or FIG. 6, bulk electrodes 140 and a supporting insulator 150 are formed on the light emitting structure 120 to form a base 145 that includes the bulk electrodes 140 and the supporting insulator 150. In addition, the base 145 may further include the second electrode 130 of FIG. 4.

The base 145 includes the supporting insulator 150 and the bulk electrodes 140 embedded in the supporting insulator 150, and may be formed by the method as shown in FIG. 5 or FIG. 6. Next, the method of forming the base 145 will be described in more detail.

In the method of FIG. 5, the bulk electrode 140 is first formed on the light emitting structure 120, as shown in FIG. 5(a).

The bulk electrodes 140 may be formed through deposition and lift-off, and may be formed so as to be disposed on the second electrode 130. In addition, at least one bulk electrode 140 may be formed on each of the device areas of the light emitting structure 120. In some implementations, the bulk electrodes 140 may be formed on the second electrode 130. Accordingly, the bulk electrode 140 may be electrically connected to the light emitting structure 120. The bulk electrode 140 may be composed of or include a single layer or multiple layers.

Then, as shown in FIG. 5(b), the insulation layer 150 is formed to cover or surround side surfaces of the bulk electrodes 140 while exposing an upper surface of the bulk electrode 140.

The insulation layer 150 may include a ceramic insulation layer and may be formed through application and curing, or through deposition. Further, the insulation layer 150 is formed to cover the plurality of device areas and may be integrally formed with the plurality of device areas.

FIG. 6 illustrates another implementation for forming the bulk electrodes and the insulation layer 150. As shown in FIG. 6, an insulation material 150a is first formed on the light emitting structure 120 to cover the light emitting structure 120 and the second electrode 130. The insulation material 150a may include a ceramic insulation material and may be formed through application and curing.

Then, as shown in FIG. 6(b), the insulation material 150a is partially removed to form a supporting insulator 150 having via-holes 150b. The via-holes 150b penetrate the insulation material 150a in the vertical direction, whereby the second electrode 130 can be partially exposed through lower sides of the via-holes 150b. The location, size and number of bulk electrodes 140 may depend on the location, size and number of via holes 150b.

Next, as shown in FIG. 6(c), bulk electrodes 140 are formed to fill the via-holes 150b. The bulk electrodes 140 may be formed through deposition or plating. The bulk electrodes 140 are formed to contact the second electrode 130 by filling the via-holes 150b, whereby the bulk electrodes 140 can be electrically connected to the light emitting structure 120.

Figure 7:
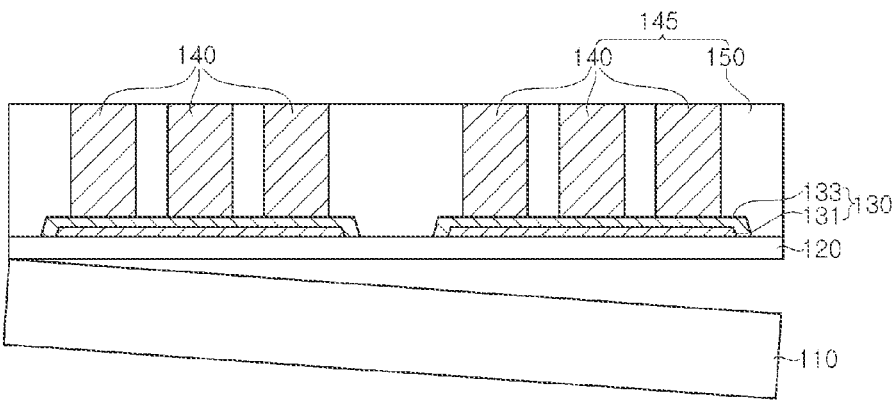

Next, referring to FIG. 7, the growth substrate 110 is separated from the light emitting structure 120.

The growth substrate 110 may be separated from the light emitting structure 120 through laser lift-off, chemical lift-off, stress lift-off, or thermal lift-off, or the like.

In this embodiment, since the light emitting structure 120 has a substantially similar coefficient of thermal expansion to that of the supporting insulator 150, the light emitting structure 120 does not suffer from the bowing phenomenon even after separation of the growth substrate. Further, since the base 145 according to the embodiment does not require high temperature upon formation of the base 145 on the light emitting structure 120, there is no significant volume variation due to difference in coefficient of thermal expansion even when the base 145 is cooled to room temperature after separation of the growth substrate 110. Accordingly, it is possible to minimize stress applied to the light emitting structure 120 upon separation of the growth substrate 110.

In addition, the base 145 according to the embodiment is provided by formation of the bulk electrodes 140 and the supporting insulator 150 and thus may be formed to various thicknesses as needed. When the thickness of the base 145 according to the embodiment is generally similar to the thickness of the conventional metal substrate, the light emitting diode fabricated by the method according to the embodiment has the same application range as in the related art.

Figure 8:
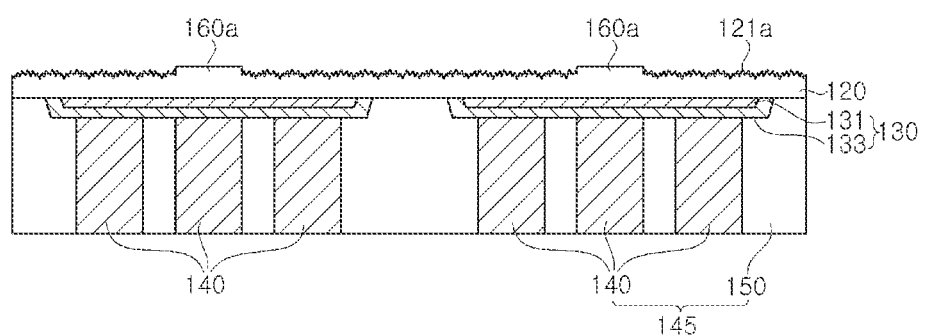

Referring to FIG. 8, a rough surface 121a is formed on an exposed surface of the light emitting structure 120 formed by separation of the growth substrate 110.

The exposed surface of the light emitting structure 120 may be a surface of the first conductive type semiconductor layer 121. For example, when the first conductive type semiconductor layer 121 includes n-type GaN, the exposed surface of the light emitting structure 120 may include an N-face.

The rough surface 121a may be formed by wet etching using a solution including, for example, at least one of KOH and NaOH, or by photo-enhanced chemical (PEC) etching. Alternatively, the rough surface 121a may be formed through combination of dry etching and wet etching. These methods for forming the rough surface 121a are provided as examples and the rough surface 121a may be formed on the surfaces of the light emitting structure 120 through various methods known to those skilled in the art. With the structure in which the rough surface 121a is formed on the surface of the light emitting structure 120, the light emitting diode has improved light extraction efficiency.

In addition, the rough surface 121a may not be formed in some region of the exposed surface of the light emitting structure 120. In some implementations, the rough surface 121a may not be formed in an electrode formation region 160a in which the first electrode 160 is formed. Here, it should be understood that the present disclosure is not limited thereto and the rough surface 121a may be also formed in the electrode formation region 160a.

Figure 9:
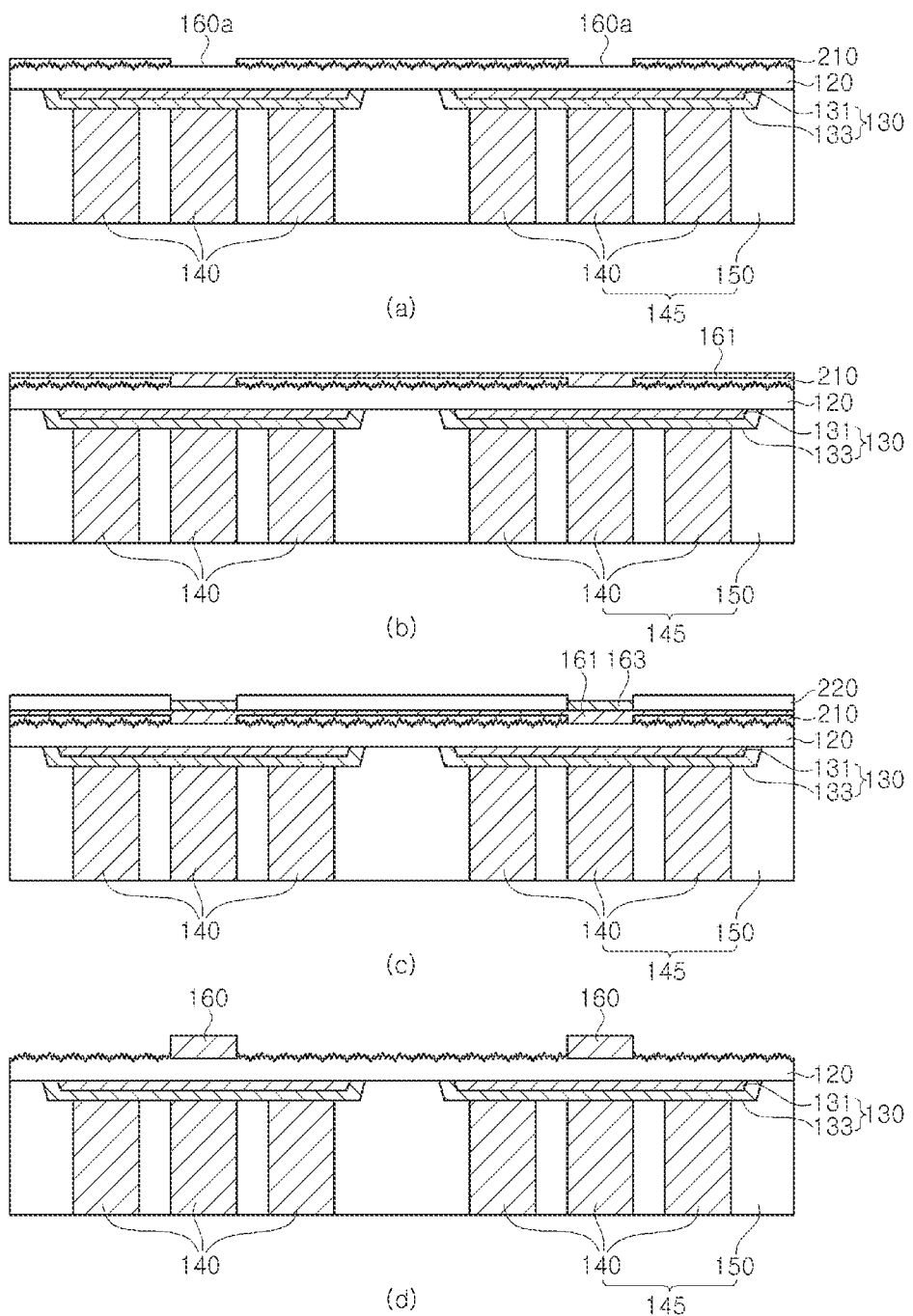

Next, referring to FIG. 9, the first electrode 160 is formed on the exposed surface of the light emitting structure 120. For example, the first electrode 160 may be formed in the electrode formation region 160a on the exposed surface of the light emitting structure 120.

Specifically, as shown in FIG. 9(a), a first mask 210 may be formed to cover the surface of the light emitting structure 120 excluding the electrode formation region 160a. The first mask 210 may include a photoresist and the like.

Next, as shown in FIG. 9(b), a first electrode pad 161 may be formed on the light emitting structure 120 by plating. The first electrode pad 161 may be formed to cover the electrode formation region 160a and the first mask 210.

Then, as shown in FIG. 9(c), a second mask 220 may be formed on the first electrode pad 161 to cover regions of the light emitting structure 120 excluding the electrode formation region 160a, followed by forming a first bump electrode 163 on the electrode formation region 160a by plating. The second mask 220 may include a photoresist and the first bump electrode 163 may fill an opening of the second mask 220.

Then, the first mask 210 and the second mask 220 are removed using a chemical solution and the like to form a first electrode 160, as shown in FIG. 9(d).

In the method described above, the first electrode 160 may include the first electrode pad 161 and the first bump electrode 163. Accordingly, the thickness of the first electrode 160 can be easily adjusted. When the first electrode 160 has a relatively large thickness, electrical connection between the light emitting diode and an external power source can be easily achieved through the first electrodes even after formation of the wavelength conversion layer 170 in the fabrication process described hereinafter.

One or more first electrodes 160 may be provided in a single device area. For example, two first electrodes 160 may be formed in a single device area.

Figure 10:
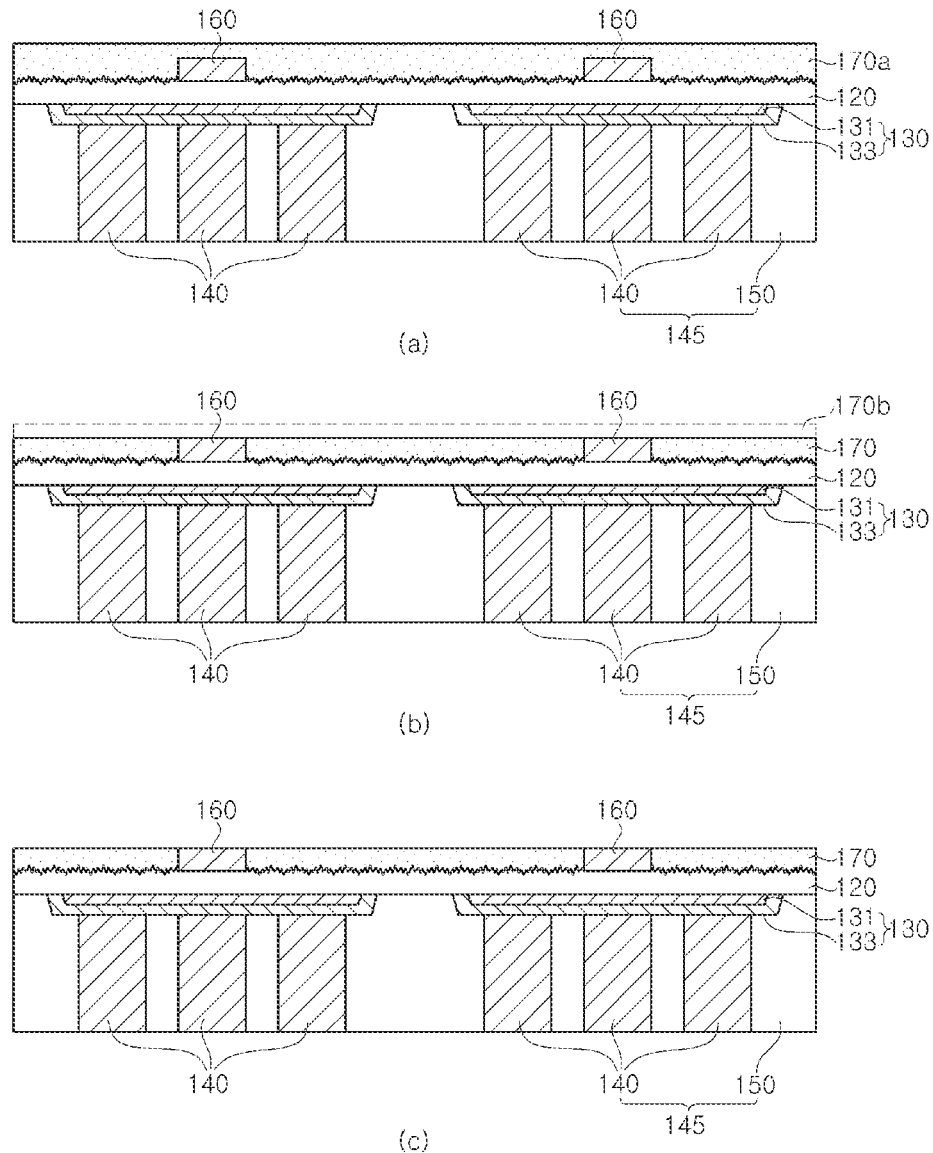

Referring to FIG. 10, a wavelength conversion layer 170 may be formed on the light emitting structure 120. The wavelength conversion layer 170 may cover a surface of the light emitting structure 120 and may partially cover side surfaces of the first electrodes 160 while at least partially exposing upper surfaces of the first electrodes 160.

As shown in FIG. 10(a), a wavelength conversion material 170a is formed to cover the light emitting structure 120 and the first electrodes 160. The wavelength conversion material 170a may be formed by applying a mixture of phosphors and a resin to the light emitting structure 120, followed by curing. Here, the wavelength conversion material 170a may have a greater thickness than the first electrodes 160, and may have a thickness of, for example, about 100 μm. In particular, the wavelength conversion material 170a may be formed to cover the entirety of the light emitting structure 120 having a plurality of device areas at the wafer level.

Next, as shown in FIGS. 10(b) and (c), an upper portion 170b of the wavelength conversion material 170a is partially removed to expose the upper surface of the first electrode 160, followed by forming the wavelength conversion layer 170.

As a result, an upper surface of the wavelength conversion layer 170 may be substantially flush with the upper surface of the first electrode 160 such that both upper surfaces of the wavelength conversion layer 170 and the first electrode 160 can become coplanar with each other. In addition, since the surface of the first electrode 160 can be easily exposed even after formation of the wavelength conversion layer 170, the light emitting diode can be easily connected to an external power source.

Figure 11:
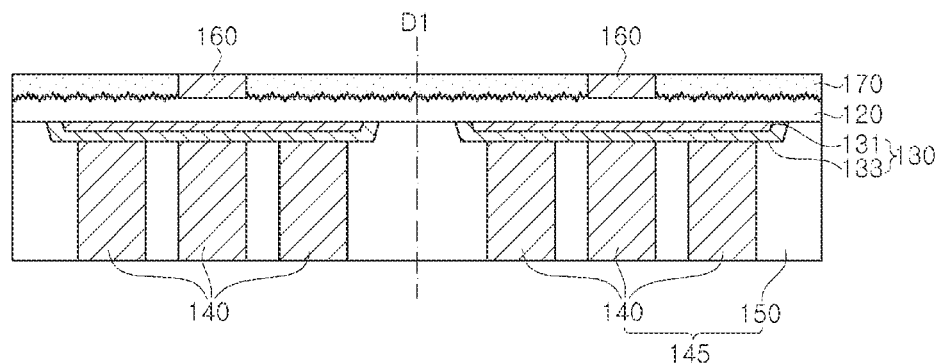

Next, referring to FIG. 11, the wavelength conversion layer 170, the light emitting structure 120, and the base 145 are divided into a plurality of individual devices along a division line D1, thereby providing light emitting diodes as shown in FIG. 1.

Division into the plurality of individual devices along the division line D1 may be achieved by dicing. In some implementations, division into the plurality of individual devices along the division line D1 may be achieved by dicing without using a laser. For example, dicing may be performed using a blade and the like.

Since the base 145 according to this embodiment may include a ceramic supporting insulator, a wafer can be easily divided into a plurality of light emitting diodes without using a laser.

In addition, since the wafer is divided by dicing without using a laser, it is possible to prevent damage to the wavelength conversion layer 170, which can occur upon division of the wafer using a laser. As a result, since the dicing process can be carried out after formation of the wavelength conversion layer 170 at the wafer level, the wavelength conversion layer 170 may be more easily formed than a conventional fabrication method in which the wavelength conversion layer 170 is formed with respect to each of the individual light emitting diodes.

Figure 12:
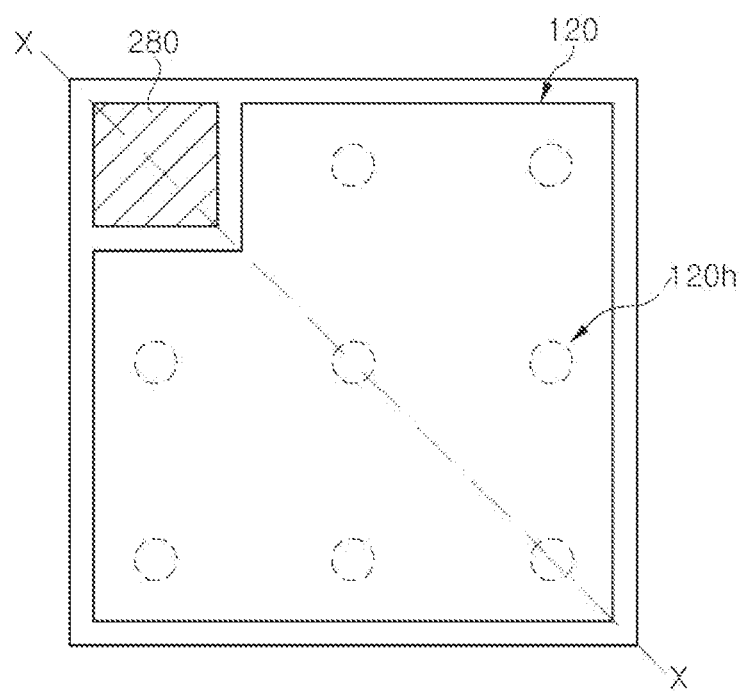
FIG. 12 to FIG. 14 are a top view, a bottom view and a sectional view of an exemplary light emitting diode according to some embodiments of the present disclosure, respectively.
Figure 13:
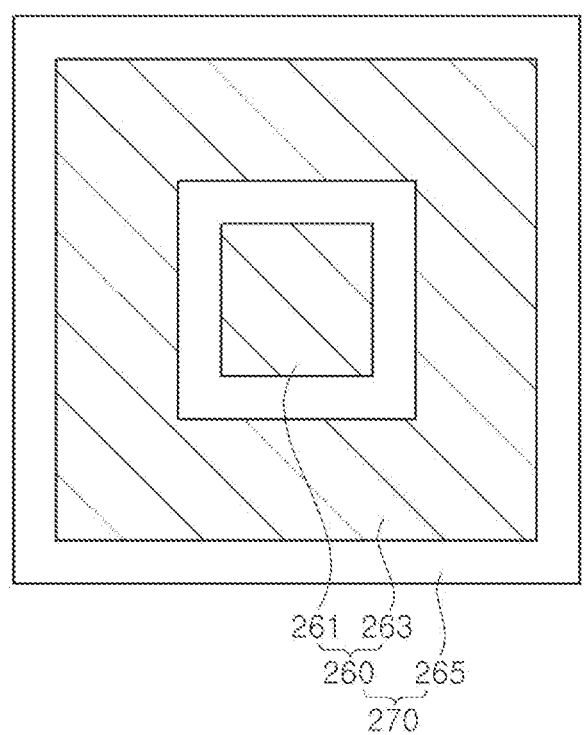
Figure 14:
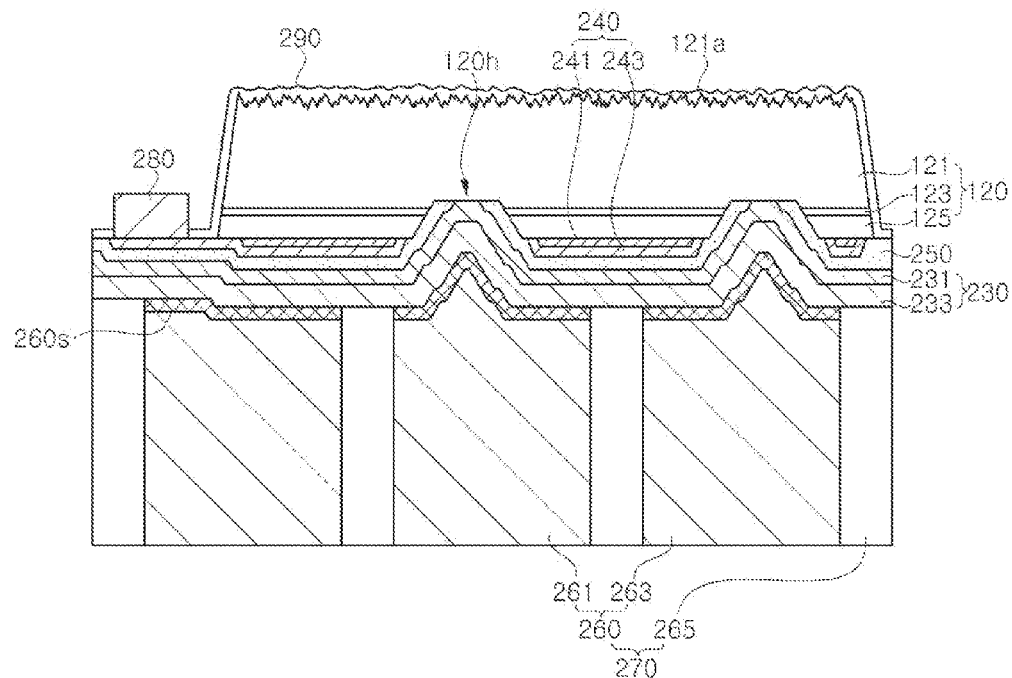
Figure 15:
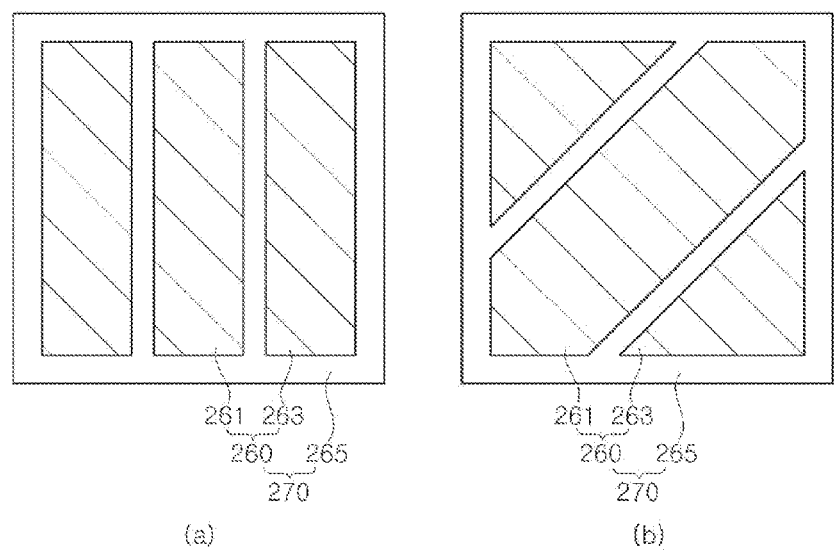
FIG. 15 shows bottom views of bases of exemplary light emitting diodes according to some embodiments of the present disclosure.

FIG. 12 to FIG. 14 are a top view, a bottom view and a sectional view of an exemplary light emitting diode according to some embodiments of the present disclosure, respectively. Specifically, FIG. 12 is a top view showing an upper surface of the light emitting diode according to this embodiment, FIG. 13 is a bottom view showing a lower surface of the light emitting diode, and FIG. 14 is a sectional view taken along line X-X of FIG. 12. In addition, FIG. 15 shows bottom views of bases of light emitting diodes according to other embodiments of the present disclosure.

Referring to FIG. 12 to FIG. 14, the light emitting diode includes a light emitting structure 120, at least one groove 120*h*, a first electrode 230, a second electrode 240, an insulation layer 250, and a base 270. The light emitting diode may further include a second electrode pad 280 and a passivation layer 290.

The light emitting structure 120 may include a first conductive type semiconductor layer 121, an active layer 123 and a second conductive type semiconductor layer 125. The first conductive type semiconductor layer 121 may be disposed on the second conductive type semiconductor layer 125 and the active layer 123 may be disposed between the first and second conductive type semiconductor layers 121 and 125. In addition, the light emitting structure 120 may further include a rough surface 121*a* formed on an upper surface of the light emitting structure 120.

The first conductive type semiconductor layer 121 and the second conductive type semiconductor layer 125 may include a III-V based compound semiconductor, for example, a nitride semiconductor such as (Al, Ga, In)N. The first conductive type semiconductor layer 121 may include an n-type semiconductor layer doped with n-type impurities, for example, Si, and the second conductive type semiconductor layer 125 may include a p-type semiconductor layer doped with p-type impurities, for example, Mg, or vice versa. The active layer 123 may include a multi-quantum well (MQW) structure, and the elements and compositions of semiconductor layers constituting the multi-quantum well structure may be adjusted to emit light having a desired peak wavelength.

The rough surface 121*a* may be formed on the upper surface of the light emitting structure 120, that is, on an upper surface of the first conductive type semiconductor layer 121, to increase surface roughness of the light emitting structure 120. The rough surface 121*a* may be formed by surface treatment of the surface of the first conductive type semiconductor layer 121 using at least one of various etching processes including drying etching, wet etching, or electrochemical etching, and the like. The rough surface 121*a* improves extraction efficiency of light emitted through the upper surface of the light emitting diode.

The at least one groove 120*h* may be formed on a lower surface of the light emitting structure 120, and the light emitting diode may include a plurality of grooves 120*h*, as shown in FIG. 12. The at least one groove 120*h* may be formed by partially removing the lower surface of the light emitting structure 120, and the first conductive type semiconductor layer 121 may be exposed inside the groove 120*h*. In addition, the second conductive type semiconductor layer 125 and the active layer 123 may be exposed to a side surface of the groove 120*h*, which has an inclination. The inclined side surface of the groove 120*h* improves step coverage characteristics of the first electrode 230 and the insulation layer 250 disposed on the side surface of the groove 120*h*.

When the light emitting diodes include a plurality of grooves 120*h*, the grooves 120*h* may be formed in various shapes. As described below, since the first electrode 230 is electrically connected to the first conductive type semiconductor layer 121 through the grooves 120*h*, the grooves 120*h* may be disposed in various arrangements given a current distribution form and a current distribution density upon operation of the light emitting diode. For example, the grooves 120*h* may have plural dot shapes, plural stripe shapes, or a combination of dot shapes and stripe shapes, without being limited thereto.

The second electrode 240 may be disposed at least on a lower surface of the second conductive type semiconductor layer 125 and electrically connected thereto, and a portion of the second electrode 240 extends from a side surface of the light emitting structure 120 such that an upper surface of the extended portion of the second electrode 240 is exposed. Further, the second electrode 240 may include a second contact layer 241 and a second cover layer 243.

The second contact layer 241 is disposed on the lower surface of the second conductive type semiconductor layer 125, whereby the second contact layer 241 can contact the second conductive type semiconductor layer 125 to form ohmic contact therewith. The second contact layer 241 may include a material capable of forming ohmic contact with the second conductive type semiconductor layer 125, for example, at least one of metallic materials and conductive oxides.

When the second contact layer 241 includes a metallic material, the second contact layer 241 is capable of forming ohmic contact with the second conductive type semiconductor layer 125 while reflecting light. Thus, the second contact layer 241 may include a metal having high reflectivity while forming ohmic contact with the second conductive type semiconductor layer 125. For example, the second contact layer 241 may include at least one of Ni, Pt, Pd, Rh, W, Ti, Al, Mg, Ag or Au.

When the second contact layer 241 includes a conductive oxide, the conductive oxide can form ohmic contact with the second conductive type semiconductor layer 125. The conductive oxides may include ITO, ZnO, AZO, or IZO, and the like. Here, the second cover layer 243 covers or surrounds at least a portion of the second contact layer 241 and includes a light reflective material to reflect light above the light emitting structure 120. The second cover layer 243 may include at least one of, for example, Au, Ni, Ti, W, Pt, Cu, Pd, Ta or Cr, and may be composed of or include a single layer or multiple layers.

Further, the second contact layer 241 may include materials having different contact resistances from the second conductive type semiconductor layer 125. For example, the second contact layer 241 may include an ohmic contact layer that forms ohmic contact with the second conductive type semiconductor layer 125 and having relatively low contact resistance, and a reflective layer that covers the ohmic contact layer. Here, although the reflective layer can form ohmic contact with the second conductive type semiconductor layer 125, contact resistance between the reflective layer and the second conductive type semiconductor layer 125 may be higher than contact resistance between the ohmic contact layer and the second conductive type semiconductor layer 125.

In some implementations, the ohmic contact layer may include a material capable of forming ohmic contact with the second conductive type semiconductor layer 125 and having relatively low contact resistance, for example, at least one of Ni, Pt, Mg, Ni/Au, or conductive oxides. Here, the conductive oxides may include ITO, IZO, IZTO, IAZO, IGZO, IGTO, AZO, IrOx, RuOx, RuOx/ITO, MgO, or ZnO, and the like. The ohmic contact layer may be formed in a pattern of regular islands, each of which may have a semi-spherical shape. Alternatively, the ohmic contact layer may be formed in a pattern of irregular islands, the shapes and sizes of which may be different from one another. Further, the ohmic contact layer may be formed in the form of a single film.

The reflective layer is formed to cover the ohmic contact layer, and at least part of the reflective layer may contact the second conductive type semiconductor layer 125. The reflective layer may include a material having high reflectivity and electrical conductivity and capable of forming ohmic contact with the second conductive type semiconductor layer 125, for example, Ag and/or Al. As the reflective layer is formed on the lower surface of the second conductive type semiconductor layer, the reflective layer reflects light emitted from the light emitting structure 120 towards an upper side of the light emitting diode, thereby improving luminous efficiency of the light emitting diode.

According to embodiments of the present disclosure, an ohmic contact layer may be formed between the reflective layer and the second conductive type semiconductor layer 125 to reduce contact resistance between the second electrode 240 and the second conductive type semiconductor layer 125.

The second cover layer 243 may be disposed on the lower surface of the second conductive type semiconductor layer 125 to cover or surround at least part of the second contact layer 241. In addition, the second cover layer 243 may be integrally formed under a region of the light emitting structure excluding the at least one hole 120h. Furthermore, a portion of the second cover layer 243 may extend from the side surface of the light emitting structure 120 to be exposed instead of being disposed under the light emitting structure 120.

The second cover layer 243 may prevent interdiffusion between the second contact layer 241 and other materials. Accordingly, it is possible to prevent increase in contact resistance and decrease in reflectivity of the second contact layer 241 caused by diffusion of the other materials into the second contact layer 241. Further, the second cover layer 243 may act as a secondary reflector. That is, when some of light traveling towards a region in which the second contact layer 241 is not formed is directed towards the second cover layer 243, the second cover layer 243 can also serve to reflect such light. Thus, the second cover layer 243 prevents foreign matter from entering the second contact layer 241, may include a material having reflectivity, for example, at least one of Au, Ni, Ti, W, Pt, Cu, Pd, Ta or Cr, and may be composed of or include a single layer or multiple layers.

Furthermore, a portion of the second cover layer 243 may extend from the side surface of the light emitting structure 120 to be exposed, and the exposed portion of the second cover layer 243 may be electrically connected to the second electrode pad 280. This structure will be described in more detail below.

The insulation layer 250 may be disposed under the light emitting structure 120 and cover or surround at least a portion of the second electrode 240. In addition, the insulation layer 250 may cover or surround the side surface of the groove 120h and may include at least one opening disposed at a portion corresponding to the location of the groove 120h such that the first conductive type semiconductor layer 121 is exposed therethrough. Thus, a lower surface of the first conductive type semiconductor layer 121 is partially exposed through the opening instead of being covered by the insulation layer 250.

The insulation layer 250 may be interposed between the first electrode 230 and the second electrode 240 and insulate first and second type electrodes 230 and 240 from each other. Thus, the insulation layer 240 may include an insulating material, for example, $SiO_2$ or $SiN_x$. Further, the insulation layer 250 may include multiple layers and may include a distributed Bragg reflector formed by alternately stacking materials having different indexes of refraction. When the insulation layer 250 includes the distributed Bragg reflector, light traveling towards a lower side of the light emitting diode is more effectively reflected upwards, thereby further improving luminous efficiency of the light emitting diode.

The first electrode 230 may be disposed under the insulation layer 250 and the light emitting structure 120 and may cover or surround a lower surface of the insulation layer 250. Further, the first electrode 230 may be electrically connected to the first conductive type semiconductor layer 121 through the opening of the insulation layer 250, which is disposed to be corresponding to the groove 120h.

The first electrode 230 may include a first contact layer 231 and a first cover layer 233, which may cover or surround at least part of the first contact layer 231. Accordingly, as shown in FIG. 14, the first contact layer 231 may be disposed between the first cover layer 233 and the insulation layer 250, and may contact the first conductive type semiconductor layer 121 through the opening of the insulation layer 250. The first cover layer 233 is formed to cover or surround at least part of the first contact layer 231, whereby it is possible to prevent diffusion of foreign matter from the base 270 described below into the first contact layer 231.

The first contact layer 231 may form ohmic contact with the first conductive type semiconductor layer 121 while reflecting light. Accordingly, the first contact layer 231 may be composed of or include a single layer or multiple layers and may include at least one stack structure of Ti/Al, Ni/Al, Cr/Al, or Pt/Al. Furthermore, in order to prevent agglomeration of Al, the first contact layer 231 may further include Ni, W, Pt, Cu, Ti, Pd, Ta, or Au, and the like. The first contact layer 231 may also include a conductive oxide such as ITO.

The first cover layer 233 may prevent diffusion of external foreign matter into the first contact layer 231, may be electrically connected to the first contact layer 231, and may also serve to reflect light. Accordingly, the first cover layer 233 may be composed of or include a single layer or multiple layers and may include Ni, W, Pt, Cu, Ti, Pd, Ta, or Au, and the like.

The base 270 is disposed at a lower side of the first electrode 230. The base 270 may include bulk electrodes 260 and a supporting insulator 265. The bulk electrodes 260 may be electrically connected to the first electrode 230 and the supporting insulator 265 may hold the bulk electrodes 260 by covering side surfaces of the bulk electrodes 260. Next, the base 270 will be described in more detail.

The bulk electrodes 260 may be electrically connected to the first electrode 230 disposed above the bulk electrodes 260, and may extend downwards and at least partially penetrate the supporting insulator 265. With this structure, lower surfaces of the bulk electrodes 260 may be exposed to a lower or bottom surface of the supporting insulator 265 and may be flush with the lower surface of the supporting insulator 265. The base may include at least two bulk electrodes 260, which are separated from each other. The supporting insulator 265 may be partially interposed between the bulk electrodes 260 separated from each other.

Further, the plural bulk electrodes 260 may include a heat dissipation unit 261 and an electrode unit 263. The heat dissipation unit 261 is separated from the electrode unit 263. The heat dissipation unit 261 may dissipate heat from the light emitting structure 120 and the electrode unit 263 may be electrically connected to the light emitting structure 120 to supply external power thereto. However, it should be understood that the present disclosure is not limited thereto, and each of the heat dissipation unit 261 and the electrode unit 263 may have both a heat dissipation function and a power supply function. For example, the electrode unit 263 may contact a conductive pattern of a separate substrate, for example, a printed circuit board (PCB), on which the light emitting diode is mounted, to supply power to the light emitting diode, and may dissipate heat from the light emitting structure 120 through the conductive pattern. On the other hand, the heat dissipation unit 261 may be connected to a heat dissipation member, for example, a heat sink, of a separate substrate, for example, a printed circuit board (PCB), on which the light emitting diode is mounted, to provide the heat dissipation function. In some implementations, the heat dissipation unit 261 may also contact the conductive pattern to provide the function of supplying power to the light emitting diode.

The heat dissipation unit 261 and the electrode unit 263 may have various structures. As shown in FIG. 13, the heat dissipation unit 261 may be surrounded by the electrode units 263. Here, the heat dissipation unit 261 may be disposed at a central region of the light emitting diode and the electrode units 263 may be disposed to surround the heat dissipation unit 261 while being separated from the heat dissipation unit 261. Alternatively, the heat dissipation unit 261 and the electrode unit 263 may be disposed as shown in FIG. 15. In FIG. 15(*a*), the heat dissipation unit 261 and the electrode unit 263 may be disposed parallel to each other in an elongated shape such that the heat dissipation unit 261 is disposed between two electrode units 263. In this embodiment, the heat dissipation unit 261 may have substantially the same horizontal sectional area as that of the electrode unit 263. Further, in FIG. 15(*b*), the electrode units 263 may be disposed at opposite sides of the light emitting diode and the heat dissipation unit 261 may be disposed between the electrode units 263. In this embodiment, the heat dissipation unit 261 may have a greater horizontal sectional area than the electrode unit 263. With this structure, the light emitting diode can have further improved heat dissipation efficiency.

The bulk electrodes 260 may include a metal or metal particles. For example, the bulk electrodes 260 may be or include a metal layer formed by deposition or plating, or may be provided in the form of aggregates of fine metal particles through sintering or other processes known in the art.

The supporting insulator 265 covers at least part of the side surfaces of the bulk electrodes 260. The supporting insulator 265 is electrically insulative. The supporting insulator 265 holds the bulk electrodes 260, and may hold the light emitting structure 120 in the course of separating a growth substrate from the light emitting structure 120 in fabrication of the light emitting diode. The supporting insulator 265 may include a material, for example, EMC (Epoxy Molding Compound), or a silicone resin, and the like. The supporting insulator 265 may also include light reflective and scattering particles such as $TiO_2$ particles. Alternatively, the supporting insulator 265 may include a ceramic material.

In addition, a difference in coefficient of thermal expansion between the supporting insulator 265 and the light emitting structure 120 may be lower than the difference in coefficient of thermal expansion between the plural bulk electrodes 260 and the light emitting structure 120. Accordingly, the base 270, which includes the supporting insulator 265 having a relatively similar coefficient of thermal expansion to that of the light emitting structure 120, acts as a support substrate. In addition, the base includes a plurality of bulk electrodes with the supporting insulator 265 disposed therebetween, thereby relieving stress and strain upon separation of the growth substrate. Accordingly, the light emitting diode minimizes a bowing phenomenon of the light emitting structure 120 upon separation of the growth substrate. As such, in fabrication of the light emitting diode according to these embodiments, the growth substrate can be separated at the wafer level. Furthermore, stress applied to the light emitting structure 120 can be minimized, thereby preventing damage to the light emitting structure 120 after separation of the growth substrate. Accordingly, the light emitting diode according to the embodiments of the present disclosure includes the light emitting structure 120 having good quality with minimal defects, thereby providing high reliability and efficiency.

Further, the base 270 may have a thickness that can relieve stress generated upon separation of the growth substrate from the light emitting structure 120 to prevent damage to the light emitting structure 120. For example, the base 260 may have a thickness of 10 μm to 100 μm.

The bulk electrodes 260 may further include a metal layer 260*s*. The metal layer 260*s* may be placed at an upper side of the bulk electrodes 260 and adjoin the first electrode 230. Formation of the metal layer 260*s* depends upon a method for forming the bulk electrodes 260 as described in detail hereinafter.

In some implementations, the bulk electrodes 260 may be formed by plating. A seed metal is formed on the entirety of the lower surface of the first electrode 230 by sputtering and the like. The seed metal may include Ti, Cu, Au, or Cr, and the like, and may serve as an under bump metallization (UBM) layer. For example, the seed metal may have a stack structure of Ti/Cu. Then, a mask is formed on the seed metal such that the mask covers a region in which the supporting insulator 265 will be formed, and opens a region in which the bulk electrodes 260 will be formed. Thereafter, the bulk electrodes 260 are formed in the open region of the mask by plating, and the mask and the seed metal are removed by etching, thereby providing the bulk electrodes 260. At this time, the seed layer remaining between the bulk electrodes 260 and the first electrode 230 forms the metal layer 260*s*.

In some implementations, the bulk electrodes 260 may be formed by screen printing. The UBM layer is formed on at least part of the lower surface of the first electrode 230 by deposition such as sputtering and patterning, or deposition and lift-off. The UBM layer may be formed on a region in which the bulk electrodes 260 will be formed, and may include a Ti or TiW layer and a Cu, Ni or Au single layer or combination thereof. For example, the UBM layer may have a stack structure of Ti/Cu. The UBM layer corresponds to the metal layer 260*s*. Then, a mask is formed thereon such that the mask covers a region in which the supporting insulator 265 will be formed, and opens a region in which the bulk electrodes 260 will be formed. Thereafter, Ag pastes, Au pastes, Cu pastes or the like are deposited on the open region through screen-printing, followed by curing. Then, the mask is removed by etching, thereby providing the bulk electrodes 260. In this embodiment, the bulk electrodes 260 may include metallic particles derived from the metal pastes.

The light emitting diode may further include a wavelength conversion layer (not shown) disposed on the light emitting structure 120. The wavelength conversion layer may include phosphors and a resin. In the wavelength conversion layer, the phosphors may be mixed with the resin to be randomly or evenly dispersed in the resin. The wavelength conversion layer may convert light emitted from the light emitting structure 120 into light having different wavelengths. As a result, a white light emitting diode can be realized.

The resin may include a polymer resin such as an epoxy resin or an acryl resin, or a silicone resin, and may act as a matrix for dispersing the phosphors.

The phosphors excite light emitted from the light emitting structure 120 to convert the light into light having different wavelengths. The phosphors may include various phosphors that are available in the art, and may include at least one type of phosphor selected from among, for example, garnet phosphors, aluminate phosphors, sulfide phosphors, oxy-nitride phosphors, nitride phosphors, fluoride phosphors, or silicate phosphors, without being limited thereto.

The second electrode pad 280 may be spaced apart from the light emitting structure 120 and may be disposed on the exposed portion of the second cover layer 243. At least a portion of a lower surface of the second electrode pad 280 may contact the second cover layer 243 to be electrically connected thereto.

The passivation layer 290 may cover the upper surface and the side surface of the light emitting structure 120. Further, the passivation layer 290 may partially cover a side surface of the second electrode pad 280. The passivation layer 290 may protect the light emitting structure 120 from external environments and may have a surface, an inclination of which is gentler than the inclination of the rough surface 121a formed on the upper surface of the first conductive type semiconductor layer 121. This structure can improve light extraction efficiency on the upper surface of the light emitting structure 120. The passivation layer 290 may include a light transmitting insulation material, for example, $SiO_2$.

Figure 16:
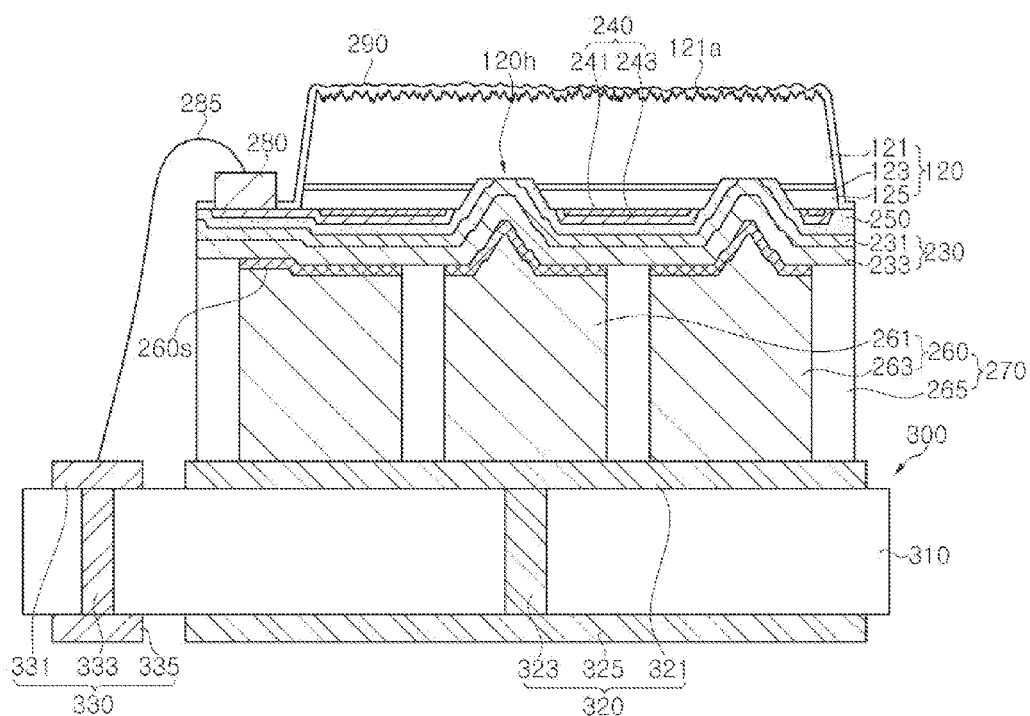
FIG. 16 is a sectional view of an exemplary light emitting device including a light emitting diode according to some embodiments of the present disclosure.

FIG. 16 is a sectional view of an exemplary light emitting device including a light emitting diode according to some embodiments of the present disclosure.

Referring to FIG. 16, the light emitting device includes a light emitting diode and a substrate 300.

The light emitting diode may be one of the light emitting diodes according to the embodiments of the present disclosure described above. In this embodiment, the light emitting device includes the light emitting diode according to the embodiment of FIG. 12 to FIG. 14. However, it should be understood that the present disclosure is not limited thereto.

The substrate 300 may include a body portion 310, a first lead electrode 320, and a second lead electrode 330. The first lead electrode 320 may include a first upper electrode 321, a first via electrode 323, and a first lower electrode 325, and the second lead electrode 330 may include a second upper electrode 331, a second via electrode 333 and a second lower electrode 335.

The body portion 310 may include an insulation material and may include a material having high thermal conductivity. The body portion 310 may include a polymer material having high thermal conductivity and/or a ceramic material. For example, the body portion 310 may include AlN ceramic.

The first upper electrode 321 may be disposed on an upper surface of the body portion 310 and the first lower electrode 325 may be disposed on a lower surface of the body portion 310. The first via electrode 323 may penetrate the body portion 310 to electrically connect the first upper and lower electrodes 321 and 325 to each other. Similarly, the second upper electrode 331 may be disposed on an upper surface of the body portion 310 and the second lower electrode 335 may be disposed on a lower surface of the body portion 310. The second via electrode 323 may penetrate the body portion 310 to electrically connect the second upper and lower electrodes 331, 335 to each other.

The first upper electrode 321 provides a region on which the light emitting diode is mounted. As shown, the light emitting diode may be mounted on the first upper electrode 321, whereby the first upper electrode 321 is electrically connected to the bulk electrodes 260 of the light emitting diode. In this embodiment, both the heat dissipation unit 261 and the electrode unit 263 of the bulk electrodes 260 may be electrically connected to the first lead electrode 320. Here, the first via electrode 323 may be disposed under the heat dissipation unit 261 and is connected to the heat dissipation unit 261 through a substantially linear passage. With this structure, heat can be effectively discharged from the lower side of the substrate through the heat dissipation unit 261 and the first via electrode 323.

The second lead electrode 330 is spaced apart from the first lead electrode 320 and electrically isolated therefrom. The second lead electrode 330 may be electrically connected to the light emitting diode through a wire 285.

Figure 17:
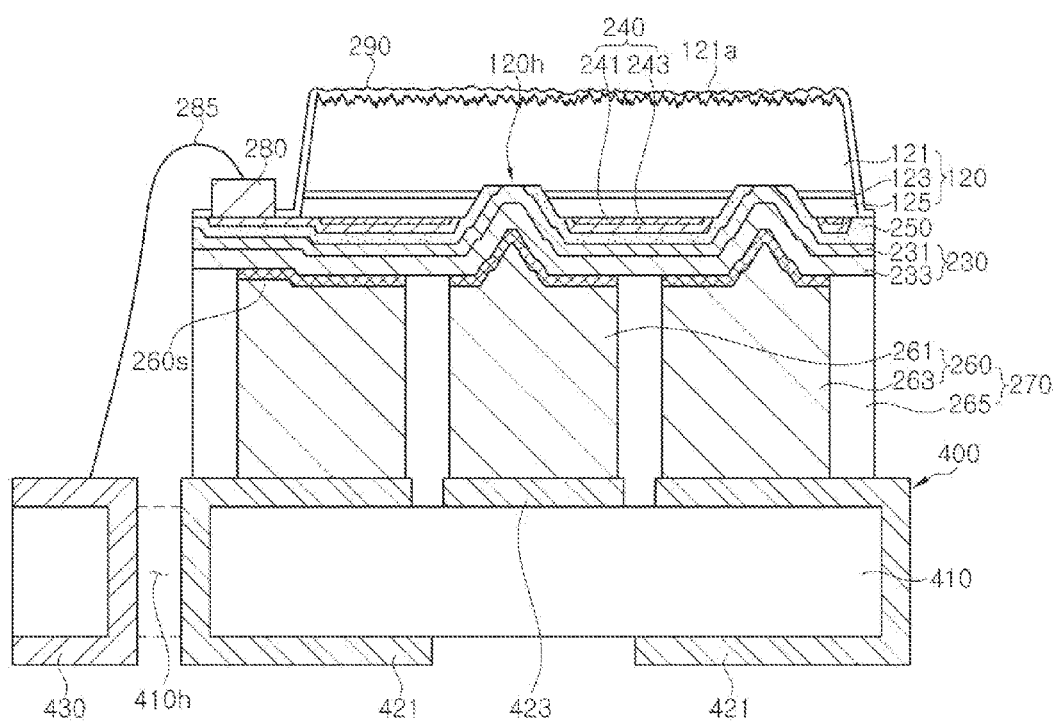
FIG. 17 is a sectional view of an exemplary light emitting device including a light emitting diode according to some embodiments of the present disclosure.

FIG. 17 is a sectional view of an exemplary light emitting device including a light emitting diode according to some embodiments of the present disclosure. The light emitting device according to this embodiment has a similar structure to the structure of the light emitting device of FIG. 16 except for features of a substrate 400. Hereinafter, the following descriptions of the light emitting device according to this embodiment are focused on the different features, and a detailed description of the same components will be omitted.

The light emitting device includes a light emitting diode and substrate 400.

The substrate 400 includes a body portion 410, a first lead electrode 421, a heat dissipation pad 423, and a second lead electrode 430.

The body portion 410 may include an insulation material and may include a material having high thermal conductivity. The body portion 410 may include a polymer material having high thermal conductivity and/or a ceramic material. For example, the body portion 410 may include AlN ceramic. In addition, the body portion 410 may include a hole 410h that penetrates the body portion 410 in the vertical direction.

The first lead electrode 421 may be formed along an upper surface of the body portion 410, a side surface of the body portion 410, a side surface of the hole 410h, and a lower surface of the body portion 410. As shown, the first lead electrode 421 may be formed to provide electrical connection on the upper and lower surfaces of the body portion 410. The light emitting diode may be disposed on the first lead electrode 421 disposed on the upper surface of the body portion 410. The light emitting diode is mounted on the body portion 410, whereby the first lead electrode 421 may be electrically connected to the bulk electrode 260. Particularly, the first lead electrode 421 may contact the electrode unit 263 of the bulk electrode 260 to form electrical connection. Further, the first lead electrode 421 may be singular or plural number. When one first lead electrode 421 is formed, the first lead electrode 421 is spaced apart from the heat dissipation pad 423 and may be formed to surround a side surface of the heat dissipation pad 423.

The heat dissipation pad 423 is disposed on the body portion 410. The heat dissipation pad 423 may contact the heat dissipation unit 261 of the bulk electrodes 260. With this structure, heat can be effectively transferred to the heat dissipation pad 423 through the heat dissipation unit 261 and then can be discharged outside through the body portion 410. It should be understood that the structure of the heat dissipation pad 423 is not limited thereto and the heat dissipation pad 423 may extend to the lower surface of the body portion 410 through the body portion 410. In this embodiment, the heat dissipation pad 423 may be separated from the first lead electrode 421 to be electrically isolated therefrom, but not limited thereto.

The second lead electrode 430 may be formed along the upper surface of the body portion 410, the side surface of the hole 410h, and the lower surface of the body portion 410. The second lead electrode 430 may be electrically connected to the light emitting diode through a wire 285.

Figure 18A:
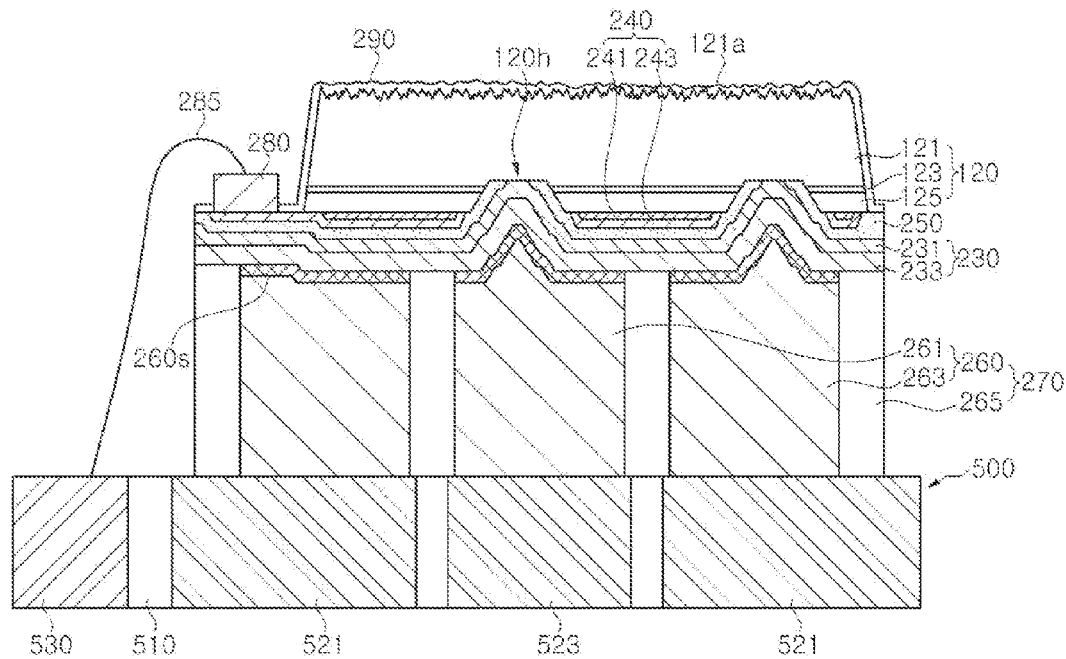
FIG. 18a and FIG. 18b are a sectional view and a plan view of an exemplary light emitting device including a light emitting diode according to some embodiments of the present disclosure, respectively.
Figure 18B:
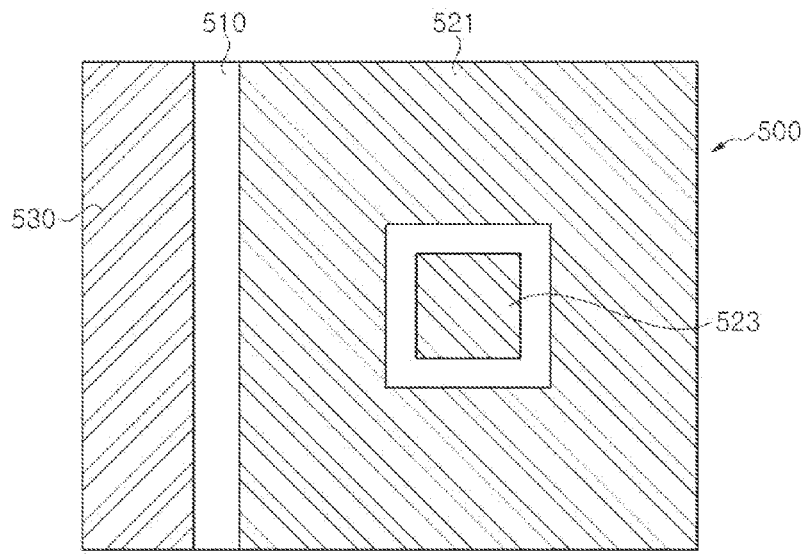

FIG. 18a and FIG. 18b are a sectional view and a plan view of an exemplary light emitting device including a light emitting diode according to some embodiments of the present disclosure. Particularly, FIG. 18b is a plan view of a substrate 500.

Referring to FIG. 18a and FIG. 18b, the light emitting device includes a light emitting diode and a substrate 500.

The substrate 500 includes an insulating portion 510, a first lead electrode 521, a heat dissipation electrode 523, and a second lead electrode 530.

Each of the first lead electrode 521, the heat dissipation electrode 523 and the second lead electrode 530 may be provided in the form of a bulk metal. Thus, the first lead electrode 521 may be electrically connected to the second lead electrode 530 through the insulating portion 510 disposed therebetween. The insulating portion 510 may be interposed between side surfaces of the first and second lead electrodes 521 and 530. Since the first lead electrode 521, the heat dissipation electrode 523 and the second lead electrode 530 are provided in the form of a bulk metal, upper and lower surfaces of each of the first lead electrode 521, the heat dissipation electrode 523 and the second lead electrode 530 are exposed to upper and lower surfaces of the substrate 500, respectively.

On the other hand, the insulating portion 510 may be interposed between the heat dissipation electrode 523 and the first lead electrode 521, whereby the heat dissipation electrode 523 may be electrically isolated from the first lead electrode 521 by the insulating portion 510. Further, each of the heat dissipation electrode 523 and the first lead electrode 521 may be formed at locations corresponding to the heat dissipation unit 261 and the electrode unit 263 of the bulk electrodes 260, respectively. For example, as shown in FIG. 18b, the heat dissipation electrode 523 may be disposed to be surrounded by the first lead electrode 521, and the light emitting diode shown in FIG. 12 to FIG. 14 may be disposed on the first lead electrode 521 and the heat dissipation electrode 523. Here, the first lead electrode 521 may contact the electrode unit 263 of the bulk electrode 260 and the heat dissipation electrode 523 may contact the heat dissipation unit 261 of the bulk electrode 260.

The second lead electrode 530 may be spaced apart from the first lead electrode 521 and may be electrically connected to the light emitting diode through the wire 285.

FIG. 19 is an exploded perspective view of an exemplary lighting apparatus to which a light emitting device according to some embodiments of the present disclosure is applied.

Referring to FIG. 19, the lighting apparatus according to this embodiment includes a diffusive cover 1010, a light emitting diode module 1020, and a body 1030. The body 1030 may receive the light emitting diode module 1020 and the diffusive cover 1010 may be disposed on the body 1030 to cover an upper side of the light emitting diode module 1020.

The body 1030 may have any shape so long as the body can supply electric power to the light emitting diode module 1020 while receiving and supporting the light emitting diode module 1020. For example, as shown in the drawing, the body 1030 may include a body case 1031, a power supply 1033, a power supply case 1035, and a power source connection section 1037.

The power supply 1033 is received in the power supply case 1035 to be electrically connected to the light emitting diode module 1020, and may include at least one IC chip. The IC chip may regulate, change or control electric power supplied to the light emitting diode module 1020. The power supply case 1035 may receive and support the power supply 1033. The power supply case 1035 having the power supply 1033 secured therein may be disposed within the body case 1031. The power source connection section 1037 is disposed at a lower end of the power supply case 1035 and coupled thereto. Accordingly, the power source connection section 1037 is electrically connected to the power supply 1033 within the power supply case 1035 and may serve as a passage through which power can be supplied from an external power source to the power supply 1033.

The light emitting diode module 1020 includes a substrate 1023 and a light emitting diode 1021 disposed on the substrate 1023. The light emitting diode module 1020 may be disposed at an upper portion of the body case 1031 and electrically connected to the power supply 1033.

As the substrate 1023, any substrate capable of supporting the light emitting diode 1021 may be used without limitation. For example, the substrate 1023 may include a printed circuit board having interconnects formed thereon. The substrate 1023 may have a shape corresponding to a securing portion formed at the upper portion of the body case 1031 so as to be stably secured to the body case 1031. The light emitting diode 1021 may include at least one of the light emitting diodes and the light emitting devices according to the embodiments described above.

The diffusive cover 1010 is disposed on the light emitting diode 1021 and may be secured to the body case 1031 to cover the light emitting diode 1021. The diffusive cover 1010 may be formed of or include a light-transmitting material, and light orientation of the lighting apparatus may be adjusted through regulation of the shape and optical transmissivity of the diffusive cover 1010. As such, the diffusive cover 1010 may be modified in various shapes depending on usage and applications of the lighting apparatus.

Figure 20:
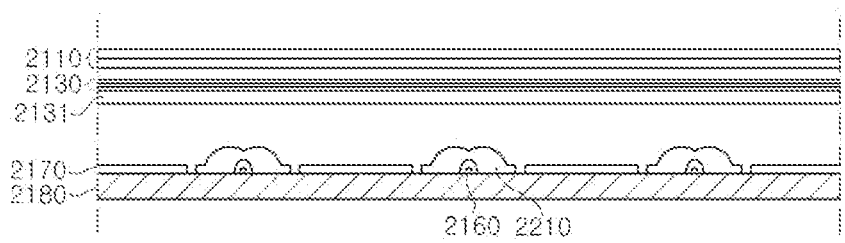
FIG. 20 is a sectional view of an exemplary display device to which a light emitting device according to some embodiments of the present disclosure is applied.

FIG. 20 is a sectional view of an exemplary display device to which a light emitting device according to some embodiments of the present disclosure is applied.

The display device according to this embodiment includes a display panel 2110, a backlight unit supplying light to the display panel 2110, and a panel guide supporting a lower edge of the display panel 2110.

The display panel 2110 is not particularly limited and may be, for example, a liquid crystal panel including a liquid crystal layer. Gate driving PCBs may be further disposed at the edge of the display panel 2110 to supply driving signals to a gate line. Here, the gate driving PCBs 2112 and 2113 may be formed on a thin film transistor substrate instead of being formed on separate PCBs.

The backlight unit includes a light source module, which includes at least one substrate and a plurality of light emitting diodes 2160. The backlight unit may further include a bottom cover 2180, a reflective sheet 2170, a diffusive plate 2131, and optical sheets 2130.

The bottom cover 2180 may be open at an upper side thereof to receive the substrate, the light emitting diodes 2160, the reflective sheet 2170, the diffusive plate 2131, and the optical sheets 2130. In addition, the bottom cover 2180 may be coupled to the panel guide. The substrate may be disposed under the reflective sheet 2170 to be surrounded by the reflective sheet 2170. However, it should be understood that other implementations are also possible. When a reflective material is coated onto a surface thereof, the substrate may be disposed on the reflective sheet 2170. Further, in this embodiment, a plurality of substrates may be arranged parallel to one other. However, it should be understood that other implementations are also possible and the light source module may include a single substrate.

The light emitting diodes 2160 may include at least one of the light emitting diodes and the light emitting devices according to the embodiments described above. The light emitting diodes 2160 may be regularly arranged in a predetermined pattern on the substrate. In addition, a lens 2210 is disposed on each of the light emitting diodes 2160 to improve uniformity of light emitted from the plurality of light emitting diodes 2160.

The diffusive plate 2131 and the optical sheets 2130 are disposed on the light emitting devices 2160. Light emitted from the light emitting devices 2160 may be supplied in the form of sheet light to the display panel 2110 through the diffusive plate 2131 and the optical sheets 2130.

In this way, the light emitting diodes according to the embodiments of the present disclosure may be applied to direct type displays like the display according to this embodiment.

Figure 21:
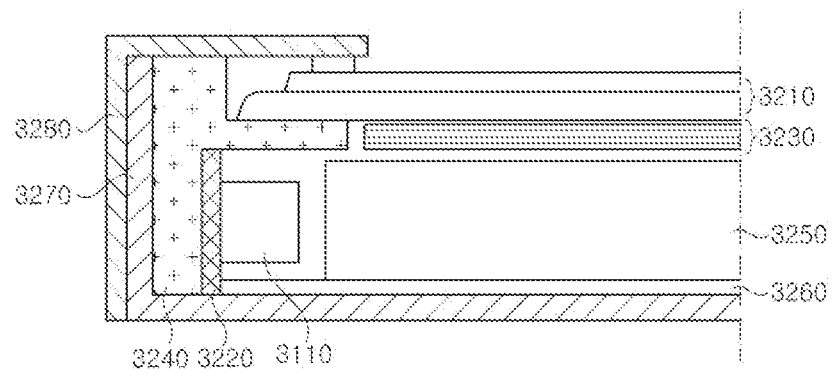
FIG. 21 is a sectional view of an exemplary display device to which a light emitting device according to some embodiments of the present disclosure is applied.

FIG. 21 is a sectional view of an exemplary display device to which a light emitting device according to some embodiments of the present disclosure is applied.

The display device according to this embodiment includes a display panel 3210 on which an image is displayed, and a backlight unit disposed at a rear side of the display panel 3210 and emitting light thereto. Further, the display device includes a frame 240 supporting the display panel 3210 and receiving the backlight unit, and covers 3240 and 3280 surrounding the display panel 3210.

The display panel 3210 is not particularly limited and may be or include, for example, a liquid crystal panel including a liquid crystal layer. A gate driving PCB may be further disposed at an edge of the display panel 3210 to supply driving signals to a gate line. Here, the gate driving PCB may be formed on a thin film transistor substrate instead of being formed on a separate PCB. The display panel 3210 is secured by the covers 3240 and 3280 disposed at upper and lower sides thereof, and the cover 3280 disposed at the lower side of the display panel 3210 may be coupled to the backlight unit.

The backlight unit supplying light to the display panel 3210 includes a lower cover 3270 partially open at an upper side thereof, a light source module disposed at one side inside the lower cover 3270, and a light guide plate 3250 disposed parallel to the light source module and converting spot light into sheet light. In addition, the backlight unit according to this embodiment may further include optical sheets 3230 disposed on the light guide plate 3250 to spread and collect light, and a reflective sheet 3260 disposed at a lower side of the light guide plate 3250 and reflecting light traveling in a downward direction of the light guide plate 3250 towards the display panel 3210.

The light source module includes a substrate 3220 and a plurality of light emitting diodes 3110 arranged at constant intervals on one surface of the substrate 3220. As the substrate 3220, any substrate capable of supporting the light emitting diodes 3110 and being electrically connected thereto may be used without limitation. For example, the substrate 3220 may include a printed circuit board.

The light emitting diodes 3110 may include at least one of the light emitting diodes and the light emitting devices according to the embodiments of the present disclosure described above. Light emitted from the light source module enters the light guide plate 3250 and is supplied to the display panel 3210 through the optical sheets 3230. The light guide plate 3250 and the optical sheets 3230 convert spot light emitted from the light emitting diodes 3110 into sheet light.

In this way, the light emitting diodes according to the embodiments may be applied to edge type displays like the display according to this embodiment.

Figure 22:
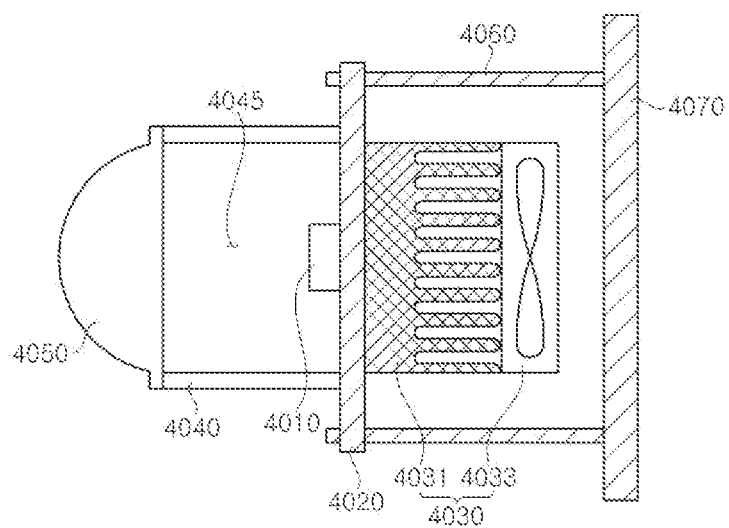
FIG. 22 is a sectional view of an exemplary headlight to which a light emitting device according to some embodiments of the present disclosure is applied.

FIG. 22 is a sectional view of an exemplary headlight to which a light emitting device according to some embodiments of the present disclosure is applied.

Referring to FIG. 22, the headlight includes a lamp body 4070, a substrate 4020, a light emitting diode 4010, and a cover lens 4050. The headlight may further include a heat dissipation unit 4030, a support rack 4060, and a connection member 4040.

The substrate 4020 is secured by the support rack 4060 and disposed above the lamp body 4070. As the substrate 4020, any member capable of supporting the light emitting diode 4010 may be used without limitation. For example, the substrate 4020 may be or include a substrate having a conductive pattern, such as a printed circuit board. The light emitting diode 4010 is disposed on the substrate 4020 and may be supported and secured by the substrate 4020. In addition, the light emitting diode 4010 may be electrically connected to an external power source through the conductive pattern of the substrate 4020. Further, the light emitting diode 4010 may include at least one of the light emitting diodes and the light emitting devices according to the embodiments of the present disclosure described above.

The cover lens 4050 is disposed on a path of light emitted from the light emitting diode 4010. For example, as shown in the drawing, the cover lens 4050 may be spaced apart from the light emitting diode 4010 by the connection member 4040 and may be disposed in a direction of supplying light emitted from the light emitting diode 4010. By the cover lens 4050, an orientation angle and/or a color of light emitted by the headlight can be adjusted. On the other hand, the connection member 4040 is disposed to secure the cover lens 4050 to the substrate 4020 while surrounding the light emitting diode 4010, and thus may act as a light guide that provides a luminous path 4045. The connection member 4040 may be formed of or include a light reflective material or coated therewith. On the other hand, the heat dissipation unit 4030 may include heat dissipation fins 4031 and/or a heat dissipation fan 4033, and dissipates heat generated upon operation of the light emitting diode 4010.

In this way, the light emitting diodes according to the embodiments of the present disclosure may be applied to headlights, particularly, headlights for vehicles, like the display device according to this embodiment.

It should be understood that the present disclosure is not limited to the embodiments and features described above, and various modifications and changes can be made without departing from the spirit and scope of the present disclosure, as set forth in the following claims.

What is claimed is:

1. A light emitting diode comprising:
   a base;
   a light emitting structure disposed over the base;

at least one first electrode disposed over the light emitting structure; and a second electrode disposed under the light emitting structure and including a top surface and a bottom surface and a side surface connecting the top surface and the bottom surface;

wherein at least a portion of the side surface of the second electrode is covered by the base, and the base includes a supporting insulator and at least one bulk electrode embedded in the supporting insulator and electrically connected to the light emitting structure, and wherein a surface of the at least one bulk electrode is exposed through the supporting insulator.

2. The light emitting diode of claim 1, wherein the supporting insulator includes a ceramic supporting insulator.

3. The light emitting diode of claim 1, wherein the second electrode includes a reflective metal layer and a cover metal layer covering at least a portion of the reflective metal layer.

4. The light emitting diode of claim 3, wherein the base includes at least two bulk electrodes separated from each other, the at least two bulk electrodes being disposed under the second electrode while contacting the second electrode.

5. The light emitting diode of claim 1, wherein the light emitting structure includes:
an active layer;
a first conductive type semiconductor layer disposed over the active layer; and
a second conductive type semiconductor layer disposed under the active layer.

6. A light emitting diode comprising:
a base;
a light emitting structure disposed over the base;
at least one first electrode disposed over the light emitting structure; and
a second electrode disposed under the light emitting structure;
wherein at least a portion of a side of the second electrode is covered by the base, and the base includes a supporting insulator and at least one bulk electrode embedded in the supporting insulator and electrically connected to the light emitting structure,
wherein a surface of the at least one bulk electrode is exposed through the supporting insulator, and
wherein the light emitting diode further includes:
a wavelength conversion layer disposed over the light emitting structure,
wherein an upper surface of the wavelength conversion layer is flush with an upper surface of the first electrode.

7. The light emitting diode of claim 6, wherein the wavelength conversion layer is disposed over an upper surface of the light emitting structure.

8. A light emitting diode comprising:
a base;
a light emitting structure disposed over the base;
at least one first electrode disposed over the light emitting structure; and
a second electrode disposed under the light emitting structure;
wherein at least a portion of a side of the second electrode is covered by the base, and the base includes a supporting insulator and at least one bulk electrode embedded in the supporting insulator and electrically connected to the light emitting structure,
wherein a surface of the at least one bulk electrode is exposed through the supporting insulator, and
wherein the light emitting diode includes two or more first electrodes, the two or more first electrodes being disposed adjacent to one other at one corner of the light emitting structure.

9. A light emitting diode comprising:
a base;
a light emitting structure disposed over the base;
at least one first electrode disposed over the light emitting structure; and
a second electrode disposed under the light emitting structure;
wherein at least a portion of a side of the second electrode is covered by the base, and the base includes a supporting insulator and at least one bulk electrode embedded in the supporting insulator and electrically connected to the light emitting structure, and
wherein a surface of the at least one bulk electrode is exposed through the supporting insulator,
wherein the light emitting structure includes:
an active layer;
a first conductive type semiconductor layer disposed over the active layer; and
a second conductive type semiconductor layer disposed under the active layer, and
wherein the light emitting structure includes a rough upper surface.

10. A light emitting diode comprising:
a base;
a light emitting structure disposed over the base and including a first conductivity type semiconductor layer, a second conductive type semiconductor layer, and an active layer, wherein the active layer is disposed between the second conductive type semiconductor layer and the first conductive type semiconductor layer;
at least one groove formed on a lower surface of the light emitting structure and partially exposing the first conductive type semiconductor layer;
a second electrode disposed at least over a lower surface of the second conductive type semiconductor layer and electrically connected to the second conductive type semiconductor layer;
an insulation layer partially covering the second electrode and the light emitting structure and including at least one opening corresponding to the at least one groove; and
a first electrode electrically connected to the first conductive type semiconductor layer exposed through the groove and at least partially covering the insulation layer,
wherein the base includes a supporting insulator, and a plurality of bulk electrodes embedded in the supporting insulator and electrically connected to the first electrode.

11. The light emitting diode of claim 10, wherein the bulk electrodes include a heat dissipation unit and an electrode unit.

12. The light emitting diode of claim 11, wherein the electrode unit is disposed to surround the heat dissipation unit.

13. The light emitting diode of claim 11, wherein the bulk electrodes include at least two electrode units and the heat dissipation unit is disposed between the two electrode units.

14. The light emitting diode of claim 10, wherein the second electrode includes:
a second contact layer contacting the second conductive type semiconductor layer; and a second cover layer at least partially covering the second contact layer, wherein a portion of the second cover layer extends from one side surface of the light emitting structure such that an upper side of the portion of the second cover layer is exposed.

15. The light emitting diode of claim 14, further including:
a second electrode pad disposed over the exposed portion of the second cover layer extending from one side surface of the light emitting structure.

16. The light emitting diode of claim 10, wherein the bulk electrodes include a metal or metal particles.

17. The light emitting diode of claim 10, wherein the supporting insulator includes at least one of an epoxy molding compound (EMC) or a ceramic material.

18. The light emitting diode of claim 10, wherein the base has a thickness in the rage of 10 μm to 100 μm.

19. A light emitting device comprising:
a substrate; and
a light emitting diode, the light emitting diode including:
a base including bulk electrodes separated from one other and a supporting insulator disposed between the bulk electrodes;
a light emitting structure disposed over the base and including a first conductive type semiconductor layer, a second conductive type semiconductor layer, and an active layer disposed between the first and second conductive type semiconductor layers and over the second conductive type semiconductor layer, wherein the light emitting structure is arranged to have a coefficient of thermal expansion that is closer to that of the supporting insulator than that of any of the bulk electrodes;
a second electrode disposed over a surface of the second conductive type semiconductor layer and electrically connected to the second conductive type semiconductor layer;
a first electrode electrically connected to the first conductive type semiconductor layer; and
a wavelength conversion layer disposed over the light emitting structure with the first electrode embedded within and exposed through the wavelength conversion layer.

20. The light emitting device of claim 19, wherein the bulk electrodes include a heat dissipation unit and an electrode unit.

21. The light emitting device of claim 20, wherein the substrate includes:
a body portion;
a first lead electrode; and
a second lead electrode;
wherein the bulk electrodes of the light emitting diode are electrically connected to the first lead electrode.

22. The light emitting device of claim 21, wherein the first lead electrode includes:
a first upper electrode disposed over the body portion;
a first lower electrode disposed under the body portion; and
a first via electrode electrically connecting the first upper electrode to the first lower electrode.

23. The light emitting device of claim 22, wherein the light emitting diode is disposed over the first lead electrode, and the first via electrode is disposed under the heat dissipation unit of the bulk electrodes.

24. The light emitting device of claim 21, wherein the substrate further includes a heat dissipation pad disposed over the body portion, and the heat dissipation pad is disposed adjacent to the heat dissipation unit.

25. The light emitting device of claim 24, wherein the heat dissipation pad is spaced apart from the first lead electrode.

26. The light emitting device of claim 20, wherein the substrate includes:
first and second lead electrodes including a bulk metal; and
an insulation layer disposed between the first and second lead electrodes, and the electrode unit is electrically connected to the first lead electrode.

27. The light emitting device of claim 26, wherein the substrate further includes a heat dissipation electrode including a bulk metal, and the heat dissipation electrode is disposed adjacent to the heat dissipation unit.

28. The light emitting device of claim 27, wherein the heat dissipation unit is surrounded by the electrode unit, and the heat dissipation electrode is surrounded by the first lead electrode.

29. A light emitting device comprising:
a substrate; and
a light emitting diode, the light emitting diode including:
a base including bulk electrodes separated from one other and a supporting insulator disposed between the bulk electrodes;
a light emitting structure disposed over the base and including a first conductive type semiconductor layer, a second conductive type semiconductor layer, and an active layer disposed between the first and second conductive type semiconductor layers and over the second conductive type semiconductor layer;
a second electrode disposed over a surface of the second conductive type semiconductor layer and electrically connected to the second conductive type semiconductor layer;
a first electrode electrically connected to the first conductive type semiconductor layer; and
a wavelength conversion layer disposed over the light emitting structure with the first electrode embedded within and exposed through the wavelength conversion layer, and
wherein a difference in thermal expansion coefficients between the supporting insulator and the light emitting structure is smaller than a difference in thermal expansion coefficients between one of the bulk electrodes and the light emitting structure, and
wherein the bulk electrodes include a heat dissipation unit and an electrode unit.

30. The light emitting device of claim 29, wherein the substrate includes:
a body portion;
a first lead electrode; and
a second lead electrode;
wherein the bulk electrodes of the light emitting diode are electrically connected to the first lead electrode.

31. The light emitting device of claim 30, wherein the first lead electrode includes:
a first upper electrode disposed over the body portion;
a first lower electrode disposed under the body portion; and
a first via electrode electrically connecting the first upper electrode to the first lower electrode.

32. The light emitting device of claim 31, wherein the light emitting diode is disposed over the first lead electrode, and the first via electrode is disposed under the heat dissipation unit of the bulk electrodes.

33. The light emitting device of claim 30, wherein the substrate further includes a heat dissipation pad disposed over the body portion, and the heat dissipation pad is disposed adjacent to the heat dissipation unit.

34. The light emitting device of claim 33, wherein the heat dissipation pad is spaced apart from the first lead electrode.

35. The light emitting device of claim 29, wherein the substrate includes:
   first and second lead electrodes including a bulk metal; and
   an insulation layer disposed between the first and second lead electrodes, and the electrode unit is electrically connected to the first lead electrode.

36. The light emitting device of claim 35, wherein the substrate further includes a heat dissipation electrode including a bulk metal, and the heat dissipation electrode is disposed adjacent to the heat dissipation unit.

37. The light emitting device of claim 36, wherein the heat dissipation unit is surrounded by the electrode unit, and the heat dissipation electrode is surrounded by the first lead electrode.

* * * * *